(12) United States Patent
Ayukawa et al.

(10) Patent No.: US 8,094,420 B2
(45) Date of Patent: Jan. 10, 2012

(54) MAGNETORESISTIVE DEVICE OF THE CCP (CURRENT PERPENDICULAR TO PLANE) TYPE WITH SINGLE-DOMAIN CONTROL OF MAGNETIZATION, AND ASSOCIATED MAGNETIC DISK SYSTEM

(75) Inventors: Toshiyuki Ayukawa, Tokyo (JP); Takahiko Machita, Tokyo (JP); Daisuke Miyauchi, Tokyo (JP); Tsutomu Chou, Tokyo (JP); Koji Shimazawa, Tokyo (JP); Shinji Hara, Tokyo (JP); Tomohito Mizuno, Tokyo (JP); Yoshihiro Tsuchiya, Tokyo (JP)

(73) Assignee: TDK Corporation, Tokyo (JP)

( * ) Notice: Subject to any disclaimer, the term of this patent is extended or adjusted under 35 U.S.C. 154(b) by 865 days.

(21) Appl. No.: 12/126,567

(22) Filed: May 23, 2008

(65) Prior Publication Data

US 2009/0290264 A1 Nov. 26, 2009

(51) Int. Cl.
*G11B 5/39* (2006.01)
(52) U.S. Cl. ............................ 360/324.12; 360/324.2
(58) Field of Classification Search ............ 360/324.11, 360/324.12, 324.2
See application file for complete search history.

(56) References Cited

U.S. PATENT DOCUMENTS 7,876,535 B2 * 1/2011 Machita et al. ............... 360/319

FOREIGN PATENT DOCUMENTS

| JP | 2002-123912 | 4/2002 |
|---|---|---|
| JP | 2004-319709 | 11/2004 |
| JP | 2005-310264 | 11/2005 |
| JP | 3950045 | 4/2007 |
| JP | 2007-242140 | 9/2007 |

OTHER PUBLICATIONS

U.S. Appl. No. 12/255,105, filed Oct. 21, 2008, Chou, et al.
U.S. Appl. No. 12/128,352, filed May 28, 2008, Mizuno, et al.
U.S. Appl. No. 12/022,538, filed Jan. 30, 2008, Chou, et al.

* cited by examiner

*Primary Examiner* — Allen Heinz
(74) *Attorney, Agent, or Firm* — Oblon, Spivak, McClelland, Maier & Neustadt, L.L.P.

(57) ABSTRACT

The invention provides a magnetoresistive device of the CCP (current perpendicular to plane) structure comprising a magnetoresistive unit sandwiched between soft magnetic shield layers with a current applied in the stacking direction. The magnetoresistive unit comprises a nonmagnetic intermediate layer sandwiched between ferromagnetic layers. A planar framework positions the soft magnetic shield layers and comprises a combination of a nonmagnetic gap layer with a bias magnetic field-applying layer constructed by repeating the stacking of a multilayer unit comprising a nonmagnetic underlay layer and a high coercive material layer. The nonmagnetic gap layer is designed and located such that a magnetic flux given out of the bias magnetic field-applying layer is efficiently directed along a closed magnetic path around the framework to form a single domain of magnetization.

25 Claims, 23 Drawing Sheets

FIG. 23
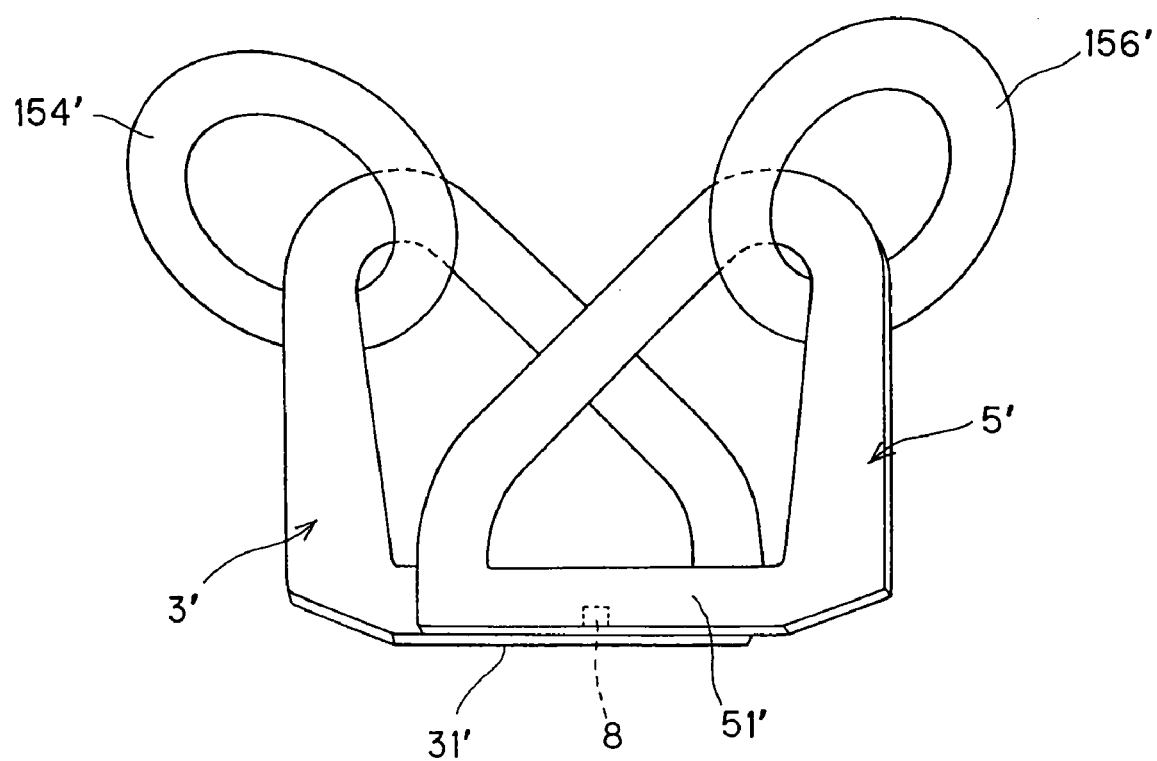
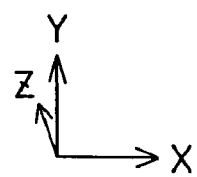

MAGNETORESISTIVE DEVICE OF THE CCP (CURRENT PERPENDICULAR TO PLANE) TYPE WITH SINGLE-DOMAIN CONTROL OF MAGNETIZATION, AND ASSOCIATED MAGNETIC DISK SYSTEM

BACKGROUND OF THE INVENTION

1. Field of the Invention

The present invention relates to a magnetoresistive device adapted to read the magnetic field intensity of magnetic recording media or the like as signals, and a thin-film magnetic head comprising that magnetoresistive device as well as a head gimbal assembly and a magnetic disk system, one each including that thin-film magnetic head.

2. Explanation of the Prior Art

A thin-film magnetic head is built up of a reproducing head having a reading magnetoresistive device (MR device) and a recording head having a writing induction type electromagnetic device.

A typical construction of part of the MR device includes a multilayer structure made up of an antiferromagnetic layer/first ferromagnetic layer/nonmagnetic intermediate layer/second ferromagnetic layer.

The first ferromagnetic layer is also called a fixed magnetization layer because its direction of magnetization remains fixed by the antiferromagnetic layer adjacent to it. By contrast, the second ferromagnetic layer is referred to as a free layer because its direction of magnetization changes by way of sensitive reaction with an external magnetic field change.

A lower electrode and shield layer and an upper electrode and shield layer (hereinafter often called the shield layers for short) are provided such that the aforesaid multilayer MR device is sandwiched between them from above and below, so that leaking magnetic fluxes from adjacent recorded data can be cut off.

The shield layers located above and below the multilayer MR device are each made of a soft magnetic thin film, and one each is generally formed in such a way as to have a closure domain structure with an easy axis of magnetization in the same direction as the track width direction of the MR device. Here, if the domain structures of the shield layers are not stably formed with variations per head, then there are also variations in the bias state applied to the MR device (especially a bias applied to the free layer), which may otherwise give rise to a problem of offering an obstacle to improvements in production yields.

In association with an increasing magnetic recording density, it is increasingly required for the MR device to be much narrower than ever before in terms of track width and read gap. As the read gap grows narrower, it causes the distance between the shield layers and the free layer forming the MR device portion to decrease drastically, letting the shield layers have strong influences on the bias state of the MR device portion. Specifically, if there is a change in the domain structures of the shield layers due to an external magnetic field, it could bring about an output fluctuation of the MR device. That is, the resistance to an external magnetic field (magnetic field resistance) could get worse.

In conjunction with such problems, JP(A)2007-242140 discloses a technique for configuring the planar shape of a shield portion in a reproducing head into an annular one to control the domain structure of the shield portion thereby reducing output fluctuations of the reproducing head under the influences of the shields and, hence, obtaining stabilized outputs.

As far as what is set forth in the aforesaid publication is concerned, however, control of the domain structure of the shield portion would be still less than satisfactory. Thus, there is a mounting demand for the development of a novel technique for holding back output fluctuations of the reproducing head under the influences of shields and, hence, obtaining stabilized outputs.

By the way, a further slimming-down of the magnetoresistive device is now in great need so as to meet recent demands for ultra-high recording density. Such being the case, there is a novel GMR device structure put forward, which has a basic structure comprising a simple triple-layer arrangement of ferromagnetic layer (free layer)/nonmagnetic intermediate layer/ferromagnetic layer (free layer), as set forth typically in U.S. Pat. No. 7,019,371B2 or U.S. Pat. No. 7,035,062B1.

For the sake of convenience, such structure is here called the dual free layer (DFL) device structure. In the DFL device structure, the two ferromagnetic layers are exchange coupled together such that their magnetizations are antiparallel with each other. And under the action of a bias magnetic field given out of a magnet located in a depth position opposite to the ABS corresponding to the surface of the device facing a medium, there is an initial state created in which the magnetizations of two magnetic layers (free layers) are inclined about 45° with respect to the track width direction. Upon detection of a signal magnetic field from the medium in the initial state of the device, the directions of magnetization of the two magnetic layers change as if scissors cut paper, with the result that there is a change in the resistance value of the device.

When such DFL device structure is applied to the so-called TMR or CPP-GMR device, it is possible to make the gap (read gap length) between the upper and lower shield layers much narrower as compared with a conventional, ordinary spin valve type CPP-GMR device. Specifically, it is possible to make do without the aforesaid antiferro-magnetic layer that is needed for the ordinary spin valve type CPP-GMR device as well as the ferromagnetic layers of the aforesaid "synthetic pinned structure". As a result, the "read gap layer" that has been said to be 30 nm at the very most can be reduced down to 20 nm or less.

However, the proposals made so far are all directed to (1) the technology that underlies exchange coupling of two ferromagnetic layers via the nonmagnetic layer, and (2) the technology that makes use of two antiferromagnetic layers to place the magnetizations of two ferromagnetic layers (free layers) in an anti parallel state. For this reason, although depending on what material is used for the nonmagnetic layer, it is impossible to obtain any strong exchange coupling between two ferromagnetic layers, or there is a problem that the purpose of reducing the "read gap length" (the gap between the upper and lower shield layers)) is only achievable at the cost of practical advantages.

The situations being like this, Applicant has already filed U.S. Ser. No. 11/946,358 for the purpose of providing a novel magnetoresistive device that makes it possible to achieve an antiparallel magnetization state for two ferromagnetic layers (free layers) with simple structure yet without being restricted by the material and specific structure of an intermediate film interposed between the two ferromagnetic layers (free layers), that makes it possible to improve on linear recording densities by the adoption of a structure capable of making the "read gap length" (the gap between the upper and lower shield layers) narrow thereby meeting recent demands for ultra-high recording densities, and that makes it possible to obtain stable magnetoresistive effect changes so that much higher reliability is achievable.

The invention of this application has for its object the provision of a magnetoresistive device that makes further progresses in the art of U.S. Ser. No. 11/946,358 already filed by Applicant, thereby stabilizing control of the domains of shield layers, improving on resistance to an external magnetic field, and improving more on the reliability of device operation.

SUMMARY OF THE INVENTION

According to the present invention, the aforesaid object is accomplished by the provision of a magnetoresistive device of the CPP (current perpendicular to plane) structure, comprising a magnetoresistive unit, and a first, substantially soft magnetic shield layer positioned below and a second, substantially soft magnetic shield layer positioned above, which are located and formed such that the magnetoresistive unit is sandwiched between them from above and below, with a sense current applied in a stacking direction, wherein:

said magnetoresistive unit comprises a nonmagnetic intermediate layer, and a first ferromagnetic layer and a second ferromagnetic layer stacked and formed such that said nonmagnetic intermediate layer is sandwiched between them, at least one of said first shield layer positioned below and said second shield layer positioned above is configured in a framework form having a planar shape (X-Y plane) defined by the width and length directions of the device, said framework has a front frame-constituting portion located on a medium opposite plane side in front and near where the magnetoresistive unit is positioned, and any other frame portion, said any other frame portion partially comprises a combination of a nonmagnetic gap layer with a bias magnetic field-applying layer, said bias magnetic field-applying layer is constructed by repetitive stacking of a multilayer unit at least twice or up to 50 times, wherein said multilayer unit comprises a nonmagnetic underlay layer and a high-coercive material layer, said nonmagnetic gap layer is designed and located such that a magnetic flux given out of said bias magnetic field-applying layer is efficiently sent out to said front frame-constituting portion, and said combination of the nonmagnetic gap layer with the bias magnetic field-applying layer forms a closed magnetic path with a magnetic flux going all the way around said framework, and turns the magnetization of said front frame-constituting portion into a single domain.

In a preferable embodiment of the inventive magnetoresistive device, the upper limit to the number of repetitive stacking, N, of the multilayer unit comprising a nonmagnetic underlay layer and a high-coercive material layer and forming a part of said bias magnetic field-applying layer is defined by the integral number part of a value (the disregard of all numbers after the decimal point) obtained by dividing the total thickness in nm of the high-coercive material layers by 8 in nm.

In a preferable embodiment of the inventive magnetoresistive device, said nonmagnetic underlay layer is composed of at least one selected from the group consisting of Cr, CrTi, CrMo, and TiW, and said high-coercive material layer is composed of at lest one selected from the group consisting of CoPt, CoCrPt, CoCrTa, CoCrPtTa, and CoNiPt.

In a preferable embodiment of the inventive magnetoresistive device, the nonmagnetic underlay layer and the high-coercive material layer, forming said bias magnetic field-applying layer, have a thickness of 2 to 15 nm and 8 to 50 nm, respectively, with the total thickness of high-coercive material layers being 100 to 400 nm.

In a preferable embodiment of the inventive magnetoresistive device, said framework comprises a front-frame constituting portion on a medium opposite plane side in front and near where the magnetoresistive unit is positioned, and a back frame-constituting portion located in the rear of said front frame-constituting portion, wherein said back frame-constituting portion is included in said any other frame portion, said back frame-constituting portion has a depth length larger than that of said front frame-constituting portion, and said back frame-constituting portion partially comprises said combination of the nonmagnetic gap layer with the bias magnetic field-applying layer.

In a preferable embodiment of the inventive magnetoresistive device, $\phi b/\phi f(s)$ is set within the range of 0.3 to 2.0 where $\phi b$ is the total quantity of a magnetic flux flowing out of said bias magnetic field-applying layer and $\phi f(s)$ is the saturation quantity of a magnetic flux for saturation of magnetization of the front frame-constituting portion where said magnetoresistive unit is positioned.

In a preferable embodiment of the inventive magnetoresistive device, said second shield layer that is positioned above is configured in a framework having a planar shape (X-Y plane) defined by the width and length directions of the device, said framework comprises a front frame-constituting portion located on a medium opposite plane side in front and near where the magnetoresistive unit is positioned, and a back frame-constituting portion located in the rear of that front frame-constituting portion, the depth length $Y_1$ of said back frame-constituting portion is larger than the depth length $Y_2$ of said front frame-constituting portion ($Y_1 > Y_2$), said back frame-constituting portion partially comprises a combination of a nonmagnetic gap layer with a bias magnetic field-applying layer, said nonmagnetic gap layer is designed and located such that a magnetic flux given out of said bias magnetic field-applying layer is efficiently sent out to said front frame-constituting portion, said combination of the nonmagnetic gap layer with the bias magnetic field-applying layer forms a closed magnetic path with a magnetic flux going all the way around said framework forming said first shield layer, and turns the magnetization of said front frame-constituting portion into a single domain, said first shield layer that is positioned below is configured in a framework having a planar shape (X-Y plane) defined by the width and length directions of the device, said framework comprises a front frame-constituting portion located on a medium opposite plane side in front and near where the magnetoresistive unit is positioned, and a back frame-constituting portion located in the rear of that front frame-constituting portion, the depth length $Y_{11}$ of said back frame-constituting portion is larger than the depth length $Y_{22}$ of said front frame-constituting portion ($Y_{11} > Y_{22}$), said back frame-constituting portion partially comprises a combination of a nonmagnetic gap layer with a bias magnetic field-applying layer, said nonmagnetic gap layer is designed and located such that a magnetic flux given out of said bias magnetic field-applying layer is efficiently sent out to said front frame-constituting portion, said combination of the nonmagnetic gap layer with the bias magnetic field-applying layer forms a closed magnetic path with a magnetic flux going all the way around said framework forming said first shield layer, and turns the magnetization of said front frame-constituting portion into a single domain.

In a preferable embodiment of the inventive magnetoresistive device, each of said first and second shield layers has a thickness of 0.5 to 2.0 μm.

In a preferable embodiment of the inventive magnetoresistive device, both ends of said magnetoresistive unit in the width direction (X-direction) are provided with a device bias-applying layer for applying a bias magnetic field to the first or second ferromagnetic layer functioning as a free layer.

In a preferable embodiment of the inventive magnetoresistive device, said bias magnetic field-applying layers and device bias-applying layer are magnetized integrally and simultaneously in the width direction (X-direction).

In a preferable embodiment of the inventive magnetoresistive device, each of the first ferromagnetic layer and second ferromagnetic layer forming a part of said magnetoresistive unit receives action such that, under influences of magnetic action of the front frame-constituting portions for said first and second shield layers, there is an antiparallel magnetization state created, in which mutual magnetizations are in opposite directions.

In a preferable embodiment of the inventive magnetoresistive device, each of the frameworks for said first and second shield layers comprise a front frame-constituting portion located on the medium opposite plane side in front and near where the magnetoresistive unit is positioned and a side frame-constituting portion located at a side position extending from the end of said front frame-constituting portion in a rear direction, said side-frame constituting portion is included in said any other frame portion, the width $Y_1$ of the side frame-constituting portion for said first shield layer is larger than the depth length $Y_2$ of the front frame-constituting portion for said first shield layer ($Y_1 > Y_2$), the width $Y_3$ of the side frame-constituting portion for said second shield layer is larger than the depth length $Y_4$ of the front frame-constituting portion for said second shield layer ($Y_3 > Y_4$), the side frame-constituting portion for said first shield layer partially comprises a combination of a first nonmagnetic gap layer with a first bias magnetic field-applying layer wherein said first nonmagnetic gap layer is designed and located in such a way as to efficiently send a magnetic flux given out of said first bias magnetic field-applying layer out to the front frame-constituting portion for said first shield layer, and said combination of the first nonmagnetic gap layer with the first bias magnetic field-applying layer forms a closed magnetic path with a magnetic flux going all the way around the framework forming said first shield layer and turns into a single domain the magnetization of the front frame-constituting portion for said first shield layer and control the direction of that magnetization, and the side frame-constituting portion for said second shield layer partially comprises a combination of a second nonmagnetic gap layer with a second bias magnetic field-applying layer wherein said second nonmagnetic gap layer is designed and located in such a way as to efficiently send a magnetic flux given out of said second bias magnetic field-applying layer out to the front frame-constituting portion for said second shield layer, and said combination of the second nonmagnetic gap layer with the second bias magnetic field-applying layer forms a closed magnetic path with a magnetic flux going all the way around the framework forming said second shield layer and turns into a single domain the magnetization of the front frame-constituting portion for said second shield layer and controls the direction of that magnetization.

In a preferable embodiment of the inventive magnetoresistive device, said first ferromagnetic layer forming a part of said magnetoresistive unit is indirectly magnetically coupled to the front frame-constituting portion for said first shield layer having a controlled direction of magnetization by way of a first exchange coupling function gap layer, and said second ferromagnetic layer forming a part of said magnetoresistive unit is indirectly magnetically coupled to the front frame-constituting portion for said second shield layer having a controlled direction of magnetization by way of a second exchange coupling function gap layer.

In a preferable embodiment of the inventive magnetoresistive device, said first exchange coupling function gap layer comprises, in order from said first shield layer side, an exchange coupling transfer layer, a gap adjustment layer and an exchange coupling adjustment layer, and said second exchange coupling function gap layer comprises, in order from said second shield layer side, an exchange coupling transfer layer, a gap adjustment layer and an exchange coupling adjustment layer.

In a preferable embodiment of the inventive magnetoresistive device, said exchange coupling transfer layer is made up of at least one material selected from the group consisting of Ru, Rh, Ir, Cr, Cu, Ag, Au, Pt, and Pd, said gap adjustment layer is made up of a ferro-magnetic material, and said exchange coupling adjustment layer is made up of at least one material selected from the group consisting of Ru, Rh, Ir, Cr, Cu, Ag, Au, Pt, and Pd.

In a preferable embodiment of the inventive magnetoresistive device, said first exchange coupling function gap layer comprises, in order from said first shield layer side, an exchange coupling transfer layer, a gap adjustment layer, an exchange coupling transfer layer, a gap adjustment layer, and an exchange coupling adjustment layer, and said second exchange coupling function gap layer comprises, in order from said second shield layer side, an exchange coupling transfer layer, a gap adjustment layer, an exchange coupling transfer layer, a gap adjustment layer, and an exchange coupling adjustment layer.

In a preferable embodiment of the inventive magnetoresistive device, said nonmagnetic intermediate layer is made up of a triple-layer structure with ZnO located at the center thereof.

According to a preferable embodiment of the inventive magneto-resistive device, in said first shield layer, $\phi'b/\phi'f(s) = 0.3$ to $2.0$ where $\phi'b$ is the total quantity of a magnetic flux flowing out of the first bias magnetic field-applying layer and $\phi'f(s)$ is the saturation quantity of a magnetic flux for saturation of magnetization of the front frame-constituting portion, and in said second shield layer, $\phi b/\phi f(s) = 0.3$ to $2.0$ where $\phi b$ is the total quantity of a magnetic flux flowing out of the second bias magnetic field-applying layer and $\phi f(s)$ is the saturation quantity of a magnetic flux for saturation of magnetization of the front frame-constituting portion.

In a preferable embodiment of the inventive magnetoresistive device, said first and second shield layers each have a thickness of 0.5 to 2.0 μm, and said first and second bias magnetic field-applying layers each have a thickness of 0.1 to 0.3 μm.

According to a preferable embodiment of the inventive magneto-resistive device, in the length direction (Y-direction) of the depth side of said magnetoresistive unit, there is a device bias-applying layer located to define a magnetization direction angle as an initial state with the first and second ferromagnetic layers functioning as free layers.

In a preferable embodiment of the inventive magnetoresistive device, said bias magnetic field-applying layers and device bias-applying layer are magnetized integrally and simultaneously in the length direction (Y-direction).

In a preferable embodiment of the inventive magnetoresistive device, each of the frameworks for said first and second shield layers comprises a front frame-constituting portion located on the medium opposite plane side and near where the magnetoresistive unit is positioned, and a coil is wound around a part of each of the frameworks for said first and second shield layers, so that by a magnetic flux generated by passing a current through said coil, the magnetization of the front frame-constituting portion for each of said first and second shield layers is turned into a single domain and the direction of magnetization is controlled.

The invention also provides a thin-film magnetic head, comprising:
a plane in opposition to a recording medium, and
a magnetoresistive device as recited above, which is located near said medium opposite plane to detect a signal magnetic field from said recording medium.

Further, the invention provides a head gimbal assembly, comprising:
a slider including a thin-film magnetic head as recited above and located in such a way as to oppose to a recording medium, and
a suspension adapted to resiliently support said slider.

Yet further, the invention provides a magnetic disk system, comprising:
a slider including a thin-film magnetic head as recited above and located in such a way as to oppose to a recording medium, and
a positioning device adapted to support and position said slider with respect to said recording medium.

BRIEF EXPLANATION OF THE DRAWINGS

FIG. 23 is illustrative in perspective of the magnetoresistive device according to a further embodiment of the invention, as viewed from the ABS (air bearing surface).

EXPLANATION OF THE PREFERRED EMBODIMENTS

Figure 1:
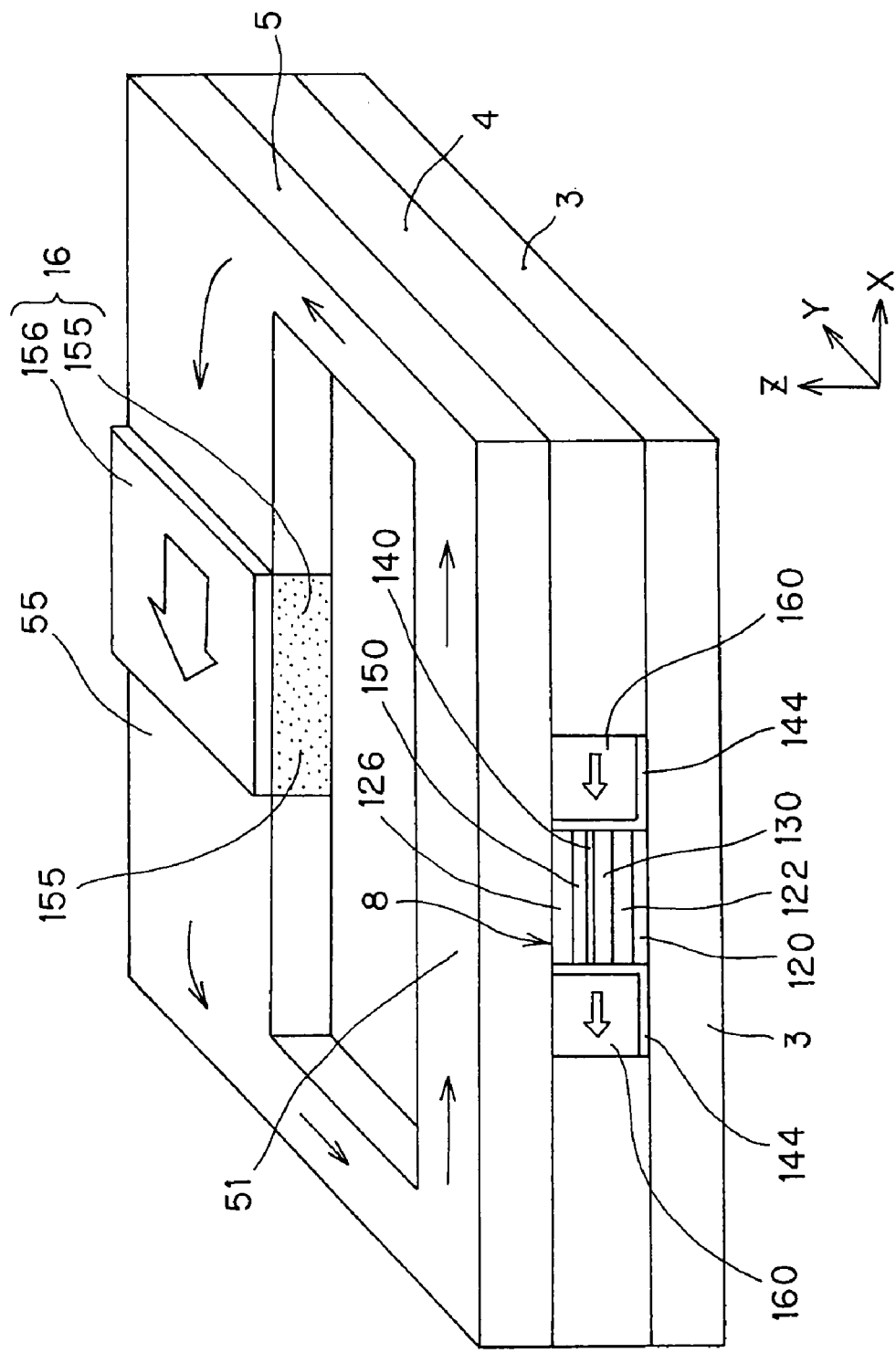
FIG. 1 is illustrative in perspective of the magnetoresistive device according to an embodiment of the invention, as viewed from the ABS (air bearing surface).

The best mode for carrying out the invention is now explained in greater details.

The magnetoresistive device of the invention is preferably used with a thin-film magnetic head in general and a reproducing head in particular.

In the following disclosure of the invention, the sizes of each device component in the X-, Y- and Z-axis directions shown in the drawings will be referred to as the "width", "length" and "thickness", respectively. The side of the device nearer to the air bearing surface (the plane of the thin-film magnetic head in opposition to the recording medium) in the Y-axis direction will be called "forward" and the opposite side (depth side) will be called "rearward", and the direction of stacking the individual films up will be called "upward" or "upper side" and the opposite direction will be called "downward" or "lower side".

Explanation of the First Embodiment

FIG. 1 is illustrative in perspective of the magnetoresistive device according to an embodiment of the invention, as viewed from the ABS (air bearing surface). The ABS is generally corresponding to a plane (hereinafter often called the medium opposite plane) at which the device lies in opposition to the recording medium; however, it is understood that the ABS here includes even a section at a position where the multilayer structure of the device can be clearly observed. For instance, a protective layer of DLC (the protective layer adapted to cover the device) or the like, in a strict sense, positioned facing the medium opposite plane may be factored out, if necessary.

Figure 2:
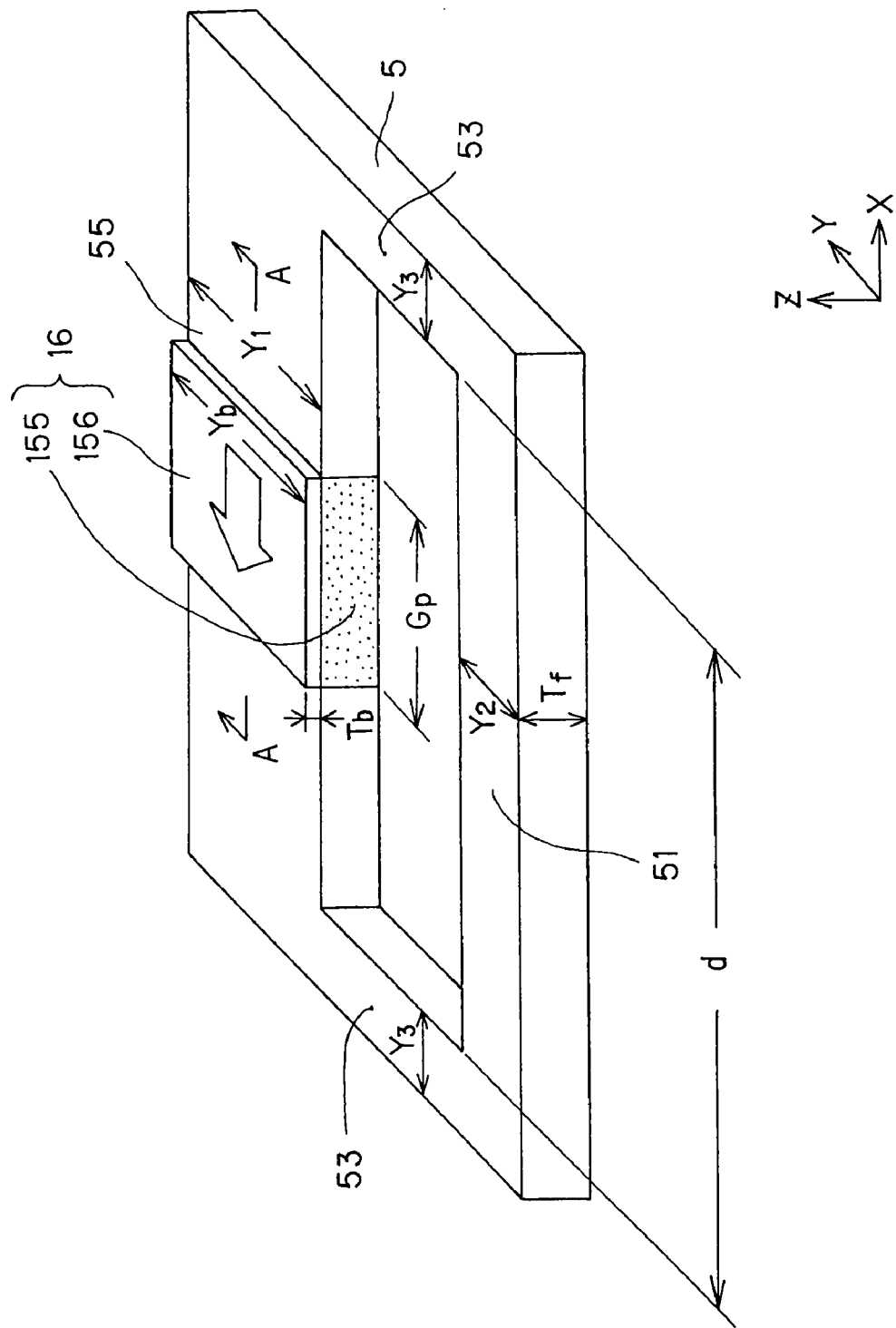
FIG. 2 is a perspective view of the second shield layer removed out of the magnetoresistive device of FIG. 1, wherein said second shield layer forming a part of that device is a substantially soft magnetic member positioned above.

FIG. 2 is a perspective view of only the second shield layer removed out of the magnetoresistive device of FIG. 1, wherein said second shield layer forming a part of that device is a substantially soft magnetic member positioned above.

Figure 3:
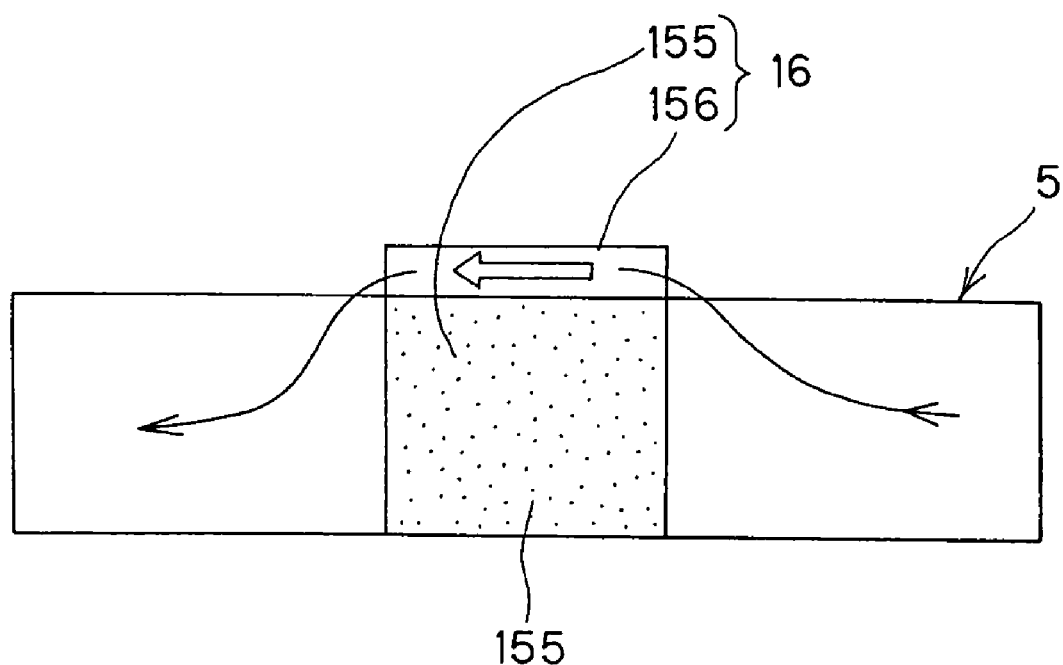
FIG. 3 is a sectional view as taken on an arrowed A-A section in FIG. 2.

FIG. 3 is a sectional view of FIG. 2 as taken on an arrowed A-A section.

Figure 4:
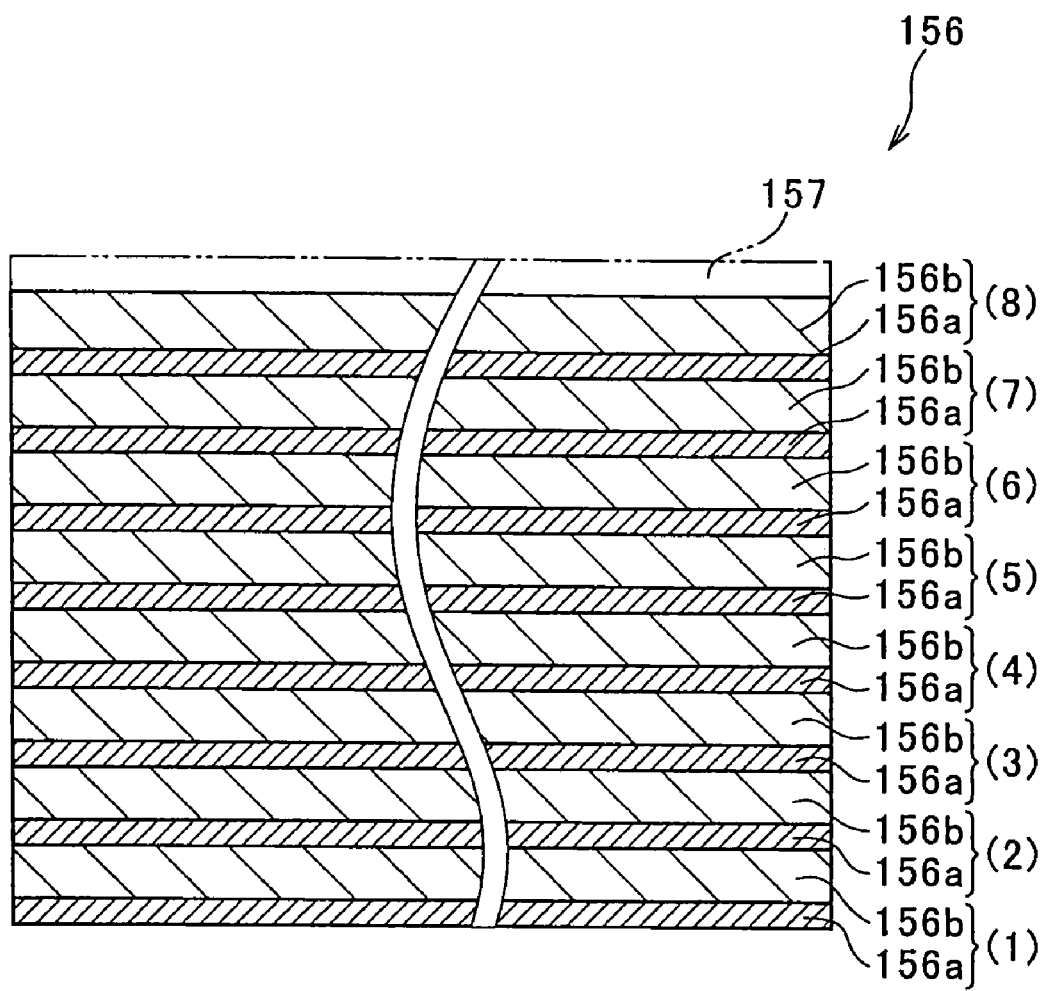
FIG. 4 is illustrative in section of a bias magnetic filed-applying layer that is constructed by repeating the stacking of a multilayer unit eight times, wherein the multilayer unit comprises a nonmagnetic underlay layer and a high-coercive material layer.

FIG. 4 is a sectional view illustrative of what state the bias magnetic field-applying layer 156 in FIG. 1 is stacked in.

[Explanation of the Structure of the Magnetoresistive Device]

As shown in FIG. 1, the magnetoresistive device of the invention comprises a magnetoresistive unit 8, and a first, substantially soft magnetic shield layer 3 (also called the lower shield layer 3) that is positioned below and a second, substantially soft magnetic shield layer 5 (also called the upper shield layer 5) that is located above wherein those shield layers are located and formed such that the magnetoresistive unit 8 is sandwiched between them from above and below.

And the magnetoresistive device of the invention is a magnetoresistive device of the CPP (current perpendicular to plane) structure with a sense current applied in the stacking direction (Z-direction) of the magnetoresistive unit 8.

The magnetoresistive unit 8 comprises a nonmagnetic intermediate layer 140, and a first 130 and a second ferromagnetic layer 150 stacked and formed such that the nonmagnetic intermediate layer 140 is sandwiched between them.

In the invention, the second shield layer 5 positioned above is configured in a framework form having a planar shape (X-Y plane) defined by the width and length directions of the device, as shown in FIG. 1. In the embodiment shown, the first shield layer 3 that is positioned below, too, is configured in the framework form, as is the case with the second shield layer 5. And the first and second shield layers 3 and 5 in FIG. 1 have their magnetization directions controlled by the respective bias magnetic field-applying layers built in them.

The second shield layer 5 positioned above and the first shield layer 3 positioned below are each preferably in the framework form; however, either one of them may be in an ordinary rectangular form rather than in the framework form, for instance, a rectangular form having a planar shape (X-Y plane) size of about 30 μm×15 μm.

The respective components of the invention are now explained in greater details.

(Explanation of the First 3, and the Second Shield Layer 5)

In the first embodiment of the invention here, the first shield layer 3 (also called the lower shield layer 3), and the second shield layer 5 (also called the upper shield layer 5) has:

(1) a function of shielding off magnetism from an external magnetic field, and
(2) an electrode function.

The aforesaid function (2) may be dispensed with, because of being also achievable by the adoption of a separately added, new electrode layer. A noteworthy point here is that to enhance the function of shielding off magnetism from an external magnetic field and make magnetic field resistance better, an unheard-of special arrangement and structure is used, as explained below in detail.

In the example of the invention, one embodiment having the same structure and arrangement is shown for the first 3, and the second shield layer 5. Reference is now made typically to the second shield layer 5.

In the invention, the second shield layer 5 positioned above is configured in a framework form having a planar shape (X-Y plane) defined by the width and length directions of the device. To put it another way, a window of substantially quadrangular shape is punched out of a rectangular sheet at its center. Only the second shield layer 5 positioned above is shown in perspective in FIG. 2.

The framework for the second shield layer 5 comprises a front frame-constituting portion 51 that is located on the medium opposite plane (ABS) side in front and near where the magnetoresistive unit 8 is positioned, and a back frame-constituting portion 55 that is located in the rear of and almost parallel with that front frame-constituting portion 51.

The depth length $Y_1$ of the back frame-constituting portion 55 is larger than the depth length $Y_2$ of the front frame-constituting portion 51 ($Y_1 > Y_2$). More preferably, the depth length $Y_1$ of the back frame-constituting portion is set in such a way as to be 1.4 to 10 times as large as the depth length $Y_2$ of the aforesaid front frame-constituting portion.

The width $Y_3$ of a side frame-constituting portion 53 making a bridge between the back frame-constituting portion 55 and the front frame-constituting portion 51 is larger than the depth length $Y_2$ of the front frame-constituting portion 51 ($Y_3 / Y_2$). More preferably, the width $Y_3$ of the side frame-constituting portion 53 is set in such a way as to be 1.2 to 2 times as large as the depth length $Y_2$ of the aforesaid front frame-constituting portion 51.

Why such requirements are in need originates from (1) the relationship between the multilayer structure and thickness of the bias magnetic field-applying layer 156 formed on the shield and the thickness of the front frame-constituting portion 51 formed for the second shield layer 5, and results eventually from (2) the relationship between the total quantity φb of a magnetic flux flowing out of the bias magnetic field-applying layer 156 and the saturation quantity φf(s) of a magnetic flux for the saturation of the magnetization of the front frame-constituting portion 51 where the magnetoresistive unit 8 is positioned, as will be described later.

As shown in FIGS. 1, 2 and 3, the back frame-constituting portion 55 positioned at the rear of the second shield layer 5 partially comprises a combination of a nonmagnetic gap layer 155 with the bias magnetic field-applying layer 156. Other than the combination of the nonmagnetic gap layer 155 with the bias magnetic field-applying layer 156, the second shield layer 5 is made of a high-permeable, soft magnetic material; this is the reason there is the "second, substantially soft magnetic shield layer 5" involved in the invention of this application. It is here noted that for the sake of drawing size and for the purpose of an easy understanding of part of the invention, there is none of the protective layer 157 drawn, which is formed on the uppermost layer of the bias magnetic field-applying layer 156. For details, see FIG. 4 referred to later.

Figure 5:
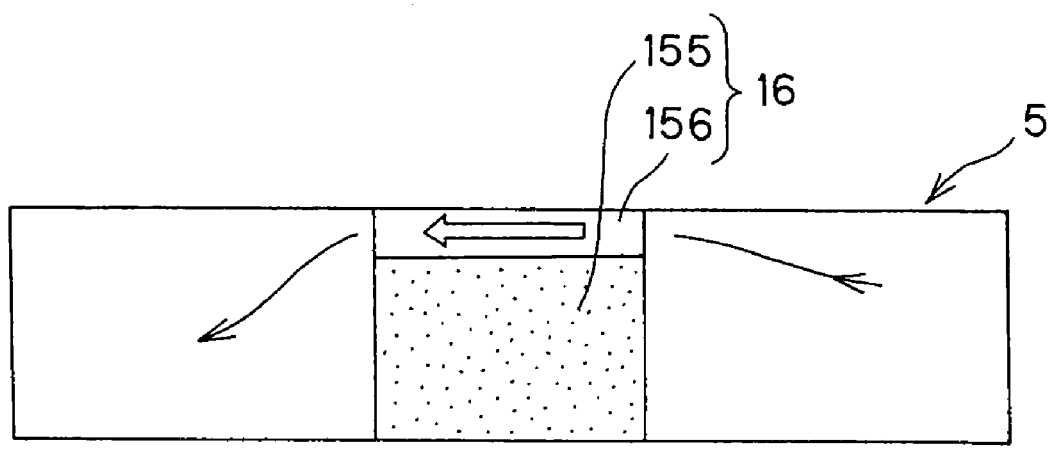
FIG. 5 is illustrative of a modification to FIG. 3.
Figure 6:
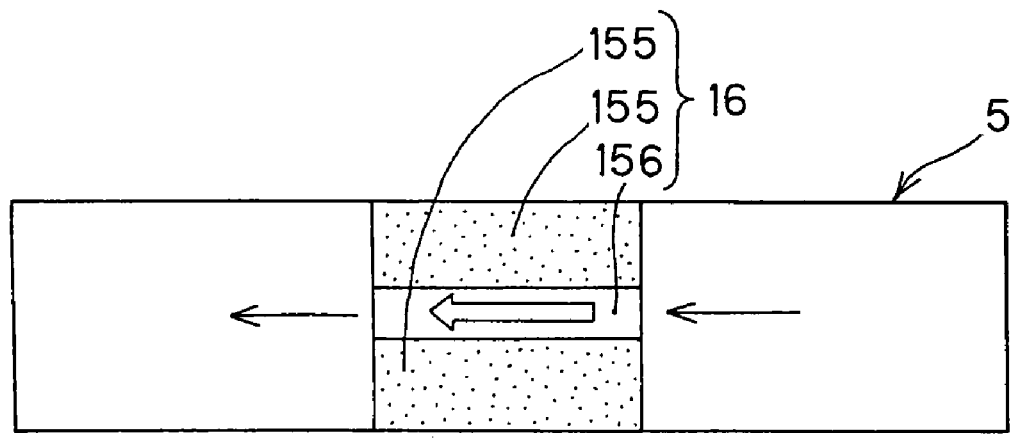
FIG. 6 is illustrative of another modification to FIG. 3.

As shown in FIGS. 2 and 3, the nonmagnetic gap layer 155 is buried in the back frame-constituting portion 55, and the bias magnetic field-applying layer 156 is formed adjacent to that nonmagnetic gap layer 155. In the embodiment shown, the bias magnetic field-applying layer 156 is formed on the nonmagnetic gap layer 155. In the embodiment illustrated, the soft magnetic member of the second shield layer 5 is partly broken by the nonmagnetic gap layer 155; however, the soft magnetic member of the second shield layer 5 may just as well be partly broken by the combination 16 of the nonmagnetic gap layer 155 and bias magnetic field-applying layer 156, as shown in FIGS. 5 and 6.

First in the invention, the structure of the bias magnetic field-applying layer 156 is of vital importance. As shown in FIG. 4, the bias magnetic field-applying layer 156 is set up by repeating the stacking of a multilayer unit comprising a nonmagnetic underlay layer 156a and a high-coercive material layer 156b at least two times or up to 50 times.

FIG. 4 shows a preferred example wherein eight multilayer units, each comprising nonmagnetic underlay layer 156a and high-coercive material layer 156b, are stacked up. As the number of stacking of the multilayer unit is below 2, it is difficult for the invention of this application to take effect. As the number of stacking of the multilayer unit is greater than 50, on the other hand, the resulting film thickness gets too thin, tending to give rise to composition mixing with the result that the function of the bias magnetic field-applying layer that it should have is not fully achievable.

As the high-coercive material layer 156b becomes thinner than 8 nm, there is an increasing percentage of rejects. Accordingly, the upper limit to the number, N, of repetitive stacking of the nonmagnetic underlay layer/high coercive material layer multilayer unit forming the aforesaid bias magnetic field-applying layer could be defined by the integral number part (the disregard of all numbers after the decimal point) of a value obtained by dividing the total thickness X (in nm) of the high-coercive material layers by 8 (in nm). X is in the range of 100 to 400 nm.

The nonmagnetic underlay layer 156a is composed of at least one selected from the group consisting of Cr, CrTi, CrMo, and TiW, and the high-coercive material layer 156b is composed of at least one selected from the group consisting of CoPt, CoCrPt, CoCrTa, CoCrPtTa, and CoNiPt.

A particularly preferred composition of the multilayer unit is Cr/CoPt, Cr/CoCrPt, CrTi/CoPt, and CrTi/CoCrPt.

The nonmagnetic underlay layer 156a should have a thickness of 2 to 15 nm, preferably 3.5 to 10 nm. As that thickness is below 2 nm, there is inconvenience that the high-coercive material layer 156b fails to have any good film quality. As that thickness is greater than 15 nm, on the other hand, the nonmagnetic underlay layer 156a is going to have a thickness than necessary, going unfavorable in terms of economic considerations and failing to make the whole multilayer structure compact.

The high-coercive material layer 156b should have a thickness of 8 to 50 nm. As that thickness is below 8 nm, it becomes too thin, tending to give rise to composition mixing with the result that the function of the high coercive material layer that it should have is not fully achievable. As that thickness is greater than 50 nm, on the other hand, there are inconveniences that the characteristics of the magnetic film such as rectangularity ratio and coercive force go worse. A decreased coercive force is going to have direct influences on deterioration of magnetic field resistance.

It is here noted that the whole high-coercive material layer 156b should have a total multilayer thickness (total thickness) of about 100 to 400 nm. Referring to FIG. 4 as an example, the total thickness of 8 films 156b should be about 100 to 400 nm.

It is also noted that reference numeral 157 stands for a protective layer for the protection of the bias magnetic field-applying layer 156, which is formed of, for instance, Cr, CrTi, Ta, Ru or the like.

Second in the invention, the action of the nonmagnetic gap layer 155 is of vital importance: it is of much importance to design and locate it such that the magnetic flux given out of the bias magnetic field-applying layer 156 is efficiently sent out to the side of the front frame-constituting portion 51.

For the nonmagnetic gap layer 155, use may be made of an oxide such as alumina or silica; a nitride such as alumina nitride or silicon nitride; and a nonmagnetic metal such as Cr, Ta, NiCr, Au, Cu or the like.

If, in FIG. 3, the nonmagnetic gap layer 155 is removed and instead the soft magnetic member of the second shield layer 5 is used there, then there would be inconvenience that much of the magnetic flux given out of the bias magnetic field-applying layer 156 returns back through the soft magnetic member used there. In other words, it would be impossible to efficiently send the magnetic flux given out of the bias magnetic field-applying layer 156 out to the side of the aforesaid front frame-constituting portion 51.

From such a point of view, the combination 16 of the nonmagnetic gap layer 155 with the bias magnetic field-applying layer 156 here is designed and set up such that there is a closed magnetic path formed with a magnetic flux going all the way around the framework forming the second shield layer 5, and the magnetization of the front frame-constituting portion 51 where the magnetoresistive unit 8 is positioned is turned into a single domain. The X-direction length Gp (FIG. 2) of the nonmagnetic gap layer 155 is preferably greater than the thickness Tf of the shield film, and the X-direction length of the bias magnetic field-applying layer 156 is preferably roughly at least 5 times as large as the thickness Tb of the bias magnetic field-applying layer 156. Upper limits to both the X-direction length Gp of the nonmagnetic gap layer 155 and the X-direction length of the bias magnetic field-applying layer 156, respectively, are defined by shield shape, and preferably smaller than the width d of the centrally punched out, almost quadrangular shape (FIG. 2).

Especially in the invention, to turn into a single domain the magnetization of the front frame-constituting portion 51 where the magnetoresistive unit 8 is positioned, it is desired that the value of $\phi b/\phi f(s)$ be in the range of 0.3 to 2.0, preferably 0.8 to 2.0, where $\phi b$ is the total quantity of the magnetic flux flowing out of the bias magnetic field-applying layer 156 and $\phi f(s)$ is the saturation quantity of the magnetic flux for the saturation of the magnetization of the front frame-constituting portion 51 where the magnetoresistive unit 8 is positioned.

The total quantity $\phi b$ of the magnetic flux flowing out of the bias magnetic field-applying layer 156 is represented in terms of the product of the residual magnetic flux density Brb of the high-coercive material layer 156b forming the bias magnetic field-applying layer 156 and the total sectional area $Sb_{total}$ of the high-coercive material layer 156b forming the bias magnetic field-applying layer 156: $\phi b = Brb \times Sb_{total}$. Note here that the sectional area $Sb_{total}$ is a Y-Z plane represented by $Tb \times \epsilon \times$ depth length Yb $(=Y_1)$ shown in FIG. 2 where $\epsilon$ is the proportion of the thickness Tb shown in FIG. 2 occupied by the high-coercive material layer 156b: $(Sb_{total} = Tb \times \epsilon \times Yb)$.

In FIG. 4, it is noted that $\epsilon$ may be represented as (the total sectional area of high-coercive material layer 156b)/[(the total sectional area of high-coercive material layer 156b)+ (the total sectional area of nonmagnetic underlay layer 156a)].

The saturation quantity φf(s) of the magnetic flux for the saturation of the magnetization of the front frame-constituting portion 51 where the magnetoresistive unit 8 is positioned is represented in terms of the product of the saturation magnetic flux density Bsf of the material forming the front frame-constituting portion 51 and the sectional area Sf of the front frame-constituting portion 51: φf(s)=Bsf×Sf. Note here that the sectional area Sf is a Y-Z plane represented by thickness Tf×depth length $Y_2$ shown in FIG. 2 (Sf=Tf×$Y_2$).

The thickness Tf of the front frame-constituting portion 51 that is the same as the thickness of the second shield layer 5 should be 0.5 to 2.0 μm. This is the thickness necessary for letting the shield layer have the so-called magnetic shield function, and that shield layer is formed by the so-called plating.

As already described, the whole high-coercive material layer 156b should have a total multilayer thickness (total thickness) of about 100 to 400 nm. Accordingly, the thickness Tb of the bias magnetic field-applying layer 156 becomes a value obtained by dividing the total multilayer thickness (total thickness) of the whole high-coercive material layer 156b by ε. The multilayer films (nonmagnetic underlay layer 156a and high-coercive material layer 156b) forming the bias magnetic field-applying layer 156 are each formed by sputtering.

Given a difference between such film thicknesses Tf and Tb, it is required to meet the aforesaid desirous numerical requirements such that the magnetic flux flowing out of the bias magnetic field-applying layer 156 can get to the front frame-constituting portion 51 where the magnetoresistive unit 8 is positioned, and the magnetic flux necessary for turning the magnetization of the front frame-constituting portion 51 into a single domain is obtainable.

It is noted that one exemplary size for the front frame-constituting portion 51 is $Y_2$=5 μm, Tf=1 μm, and X-direction width=30 μm.

For the substantially soft magnetic material for the second shield layer 5, there is the mention of NiFe (permalloy), CoZrTa, sendust, NiFeCo, CoZrNb, and so on.

It is desired that the first shield layer 3, too, is configured as is the case with the aforesaid second shield layer 5. This is to make sure output fluctuations of the reproducing head under the influences of the shields are kept more in check to obtain more stabilized outputs.

That is, the first shield layer 3 that is positioned below is configured in a framework form having a planar shape (X-Y plane) defined by the width and length directions of the device, and the aforesaid framework comprises a front frame-constituting portion located on the medium opposite plane side in front and near where the magnetoresistive unit 8 is positioned, and a back frame-constituting portion located in the rear of the front frame-constituting portion. The depth length $Y_{11}$ (corresponding to $Y_1$ in FIG. 2) of the back frame-constituting portion is larger than the depth length $Y_{22}$ (corresponding to $Y_2$ in FIG. 2) of the aforesaid front frame-constituting portion ($Y_{11}$>$Y_{22}$). The aforesaid back frame-constituting portion partially comprises a combination of a nonmagnetic gap layer with a bias magnetic field-applying layer. That bias magnetic field-applying layer is set up by repeating the stacking of a multilayer unit comprising a nonmagnetic underlay layer and a high-coercive material layer at least two times or up to 50 times. As the high-coercive material layer becomes thinner than 8 nm, there is an increasing percentage of rejects. Accordingly, the upper limit to the number of repetitive stacking, N, of the nonmagnetic underlay layer/high coercive material layer multilayer unit forming the aforesaid bias magnetic field-applying layer could be defined by the integral number part (the disregard of all numbers after the decimal point) of a value obtained by dividing the total thickness X (in nm) of the high-coercive material layers by 8 (in nm). X is in the range of 100 to 400 nm.

The aforesaid nonmagnetic gap layer is designed and located such that it works to efficiently send a magnetic flux given out of the aforesaid bias magnetic field-applying layer out to the side of the aforesaid front frame-constituting portion, and the aforesaid combination of the nonmagnetic gap layer with the aforesaid bias magnetic field-applying layer is set up in such a way as to form a closed magnetic path with a magnetic flux going all the way around the framework forming the first shield layer, and turn into a single domain the magnetization of the aforesaid front frame-constituting portion.

In the first shield layer 3, therefore, φ'b/φ'f(s) is set within the range of 0.3 to 2.0, preferably 0.8 to 2.0 where φ'b is the total quantity of the magnetic flux flowing out of the bias magnetic field-applying layer and φ'f(s) is the saturation quantity of the magnetic flux for the saturation of the magnetization of the front frame-constituting portion where the magnetoresistive unit is positioned.

Also in the first shield layer 3, the depth length $Y_{11}$ (corresponding to $Y_1$ in FIG. 2) of the back frame-constituting portion is set up in such a way as to be 1.4 to 10 times as large as the depth length $Y_{22}$ (corresponding to $Y_2$ in FIG. 2) of the aforesaid front frame-constituting portion.

In the first shield layer 3, too, an arrangement comprising such a nonmagnetic gap layer and bias magnetic field-applying layer combination as mentioned in conjunction with the second shield layer 5 may just as well be used.

(Explanation of the Magnetoresistive Unit 8)

As shown in FIG. 1, the magnetoresistive device in the embodiment here comprises a first 3 and a second shield layer 5 that are mutually opposed above and below in the drawing at a given interval, a magnetoresistive unit 8 of the CPP structure interposed between the first 3 and the second shield layer 5, an insulating film 144 adapted to cover two sides of the magnetoresistive unit 8 and a part of the upper surface of the first shield layer 3 along two such sides, and two device bias-applying layers 160 adjacent to both sides of the magnetoresistive unit 8 by way of the insulating film 144.

For the magnetoresistive unit 8, for instance, use may be made of a CPP-GMR device unit harnessing the giant magnetoresistive effect, and a TMR device unit tapping the tunnel type magnetoresistive effect. As shown in FIG. 1, the magnetoresistive unit 8 comprises, and is built up of, a nonmagnetic intermediate layer 140, and a first 130 and a second ferromagnetic layer 150 stacked and formed with the nonmagnetic intermediate layer 140 held between them.

In FIG. 1, for instance, the first ferromagnetic layer 130 functions as a fixed magnetization layer 130 having a fixed direction of magnetization, and the second ferromagnetic layer 150 functions as a free layer 150 working such that its direction of magnetization changes depending on an externally applied signal magnetic field.

More specifically, the magnetoresistive unit 8 exemplified in FIG. 1 is set up in the form of a multilayer film wherein an antiferromagnetic layer 122 as a pinning layer formed on the first shield layer 3 by way of an underlay layer 120, a fixed magnetization layer 130 formed on that antiferromagnetic layer 122, a nonmagnetic intermediate layer 140 formed on that fixed magnetization layer 130, a free layer 150 formed on that nonmagnetic intermediate layer 140 and a cap layer 126 (protective layer 126) formed on that free layer 150 are stacked up in order.

This multilayer film is held by the front frame-constituting portions on the ABS side of the first 3 and the second shield layer 5, and with a voltage applied between the first 3 and the second shield layer 5, there is a sense current flowing in the thickness direction of the multilayer film.

Each of the layers forming the magnetoresistive unit 8 is now explained at greater length.

(Explanation of the Fixed Magnetization Layer 130)

In the invention, the fixed magnetization layer 130 is formed on the antiferromagnetic layer 122 having a pinning action via the underlay layer 120 formed on the first shield layer 3.

The fixed magnetization layer 30 may be configured in either one single film form or multilayer film form.

Referring typically to the multilayer film form that is a preferable one, the fixed magnetization layer 130 has a so-called synthetic pinned layer comprising, in order from the side of the antiferromagnetic layer 122, an outer layer, a nonmagnetic layer and an inner layer, all stacked together in order. The outer and the inner layer are each provided by a ferromagnetic layer made of, for instance, a ferromagnetic material containing Co, and Fe. The outer and the inner layer are antiferromagnetically coupled and fixed such that their magnetization directions are opposite to each other.

The outer, and the inner layer is preferably formed of, for instance, a $Co_{70}Fe_{30}$ (at %) alloy layer. The outer layer has a thickness of preferably about 3 to 7 nm, and the inner layer has a thickness of preferably about 3 to 10 nm. The nonmagnetic layer, for instance, is made of a nonmagnetic material containing at least one selected from the group consisting of Ru, Rh, Ir, Re, Cr, Zr and Cu, and has a thickness of, for instance, about 0.35 to 1.0 nm.

(Explanation of the Free Layer 150 and Cap Layer 126)

The free layer 150 has its magnetization direction changing depending on an external magnetic field, i.e., a signal magnetic field from the recording medium, and is formed of a ferromagnetic layer (soft magnetic layer) having a small coercive force. The free layer 150 has a thickness of, for instance, about 2 to 10 nm, and may be in either single layer form or multilayer form including a plurality of ferromagnetic layers.

As shown in FIG. 1, there is the cap (protective) layer 126 formed on such free layer 150. The cap layer 126, for instance, is formed of a Ta or Ru layer, and has a thickness of about 0.5 to 20 nm.

(Explanation of the Nonmagnetic Intermediate Layer 140)

The device here is preferably represented by the so-called CPP-GMR device and TMR device. For this reason, the nonmagnetic intermediate layer 140, for instance, is made of one material selected from the group consisting of $Al_2O_X$, MgO, Cu, Au, Ag, ZnO, $TiO_X$, $SiO_2$, $HfO_X$, and $ZrO_X$, and has a thickness of about 1.0 to 3.0 nm.

(Explanation of the Antiferromagnetic Layer 122)

The antiferromagnetic layer 122 functioning as the pinning layer works such that by way of exchange coupling with the fixed magnetization layer 130 as described above, the magnetization direction of the fixed magnetization layer 130 is fixed.

For instance, the antiferromagnetic layer 122 is made of an antiferromagnetic material containing at least one element M' selected from the group of Pt, Ru, Rh, Pd, Ni, Cu, Ir, Cr and Fe, and Mn. The content of Mn is preferably 35 to 95 at %. The antiferromagnetic material is broken down into two types: (1) a non-heat treatment type antiferromagnetic material that shows anti-ferromagnetism even in the absence of heat treatment to induce an exchange coupling magnetic field between it and a ferromagnetic material, and (2) a heat treatment type antiferromagnetic material that is going to show anti-ferromagnetism by heat treatment. In the invention, both types (1) and (2) may be used without restriction. For instance, the non-heat treatment type antiferromagnetic material is exemplified by RuRhMn, FeMn, and IrMn, and the heat treatment type antiferromagnetic material is exemplified by PtMn, NiMn, and PtRhMn.

The antiferromagnetic layer 122 has a thickness of about 4 to 30 nm.

It is here noted that for the layer for fixing the magnetization direction of the fixed magnetization layer 130, it is acceptable to use a hard magnetic layer comprising a hard magnetic material such as CoPt in place of the aforesaid antiferromagnetic layer.

The underlay layer 120 formed below the anti-ferromagnetic layer 122 is provided to improve on the crystallizability and orientation of each of the layers stacked on it in general, and the exchange coupling of the antiferromagnetic layer 120 and the fixed magnetization layer 130 in particular. For such underlay layer 120, for instance, a multilayer of Ta and NiCr layers is used. The underlay layer 120 has a thickness of about 2 to 6 nm as an example.

Further, the insulating layer 144 shown in FIG. 1 is made of, for instance, alumina. For the device bias-applying layers 160, for instance, a hard magnetic layer (hard magnet) or a multilayer structure of a ferromagnetic layer and an antiferromagnetic layer may be used, and there is the specific mention of CoPt or CoCrPt.

It is here noted that, as shown in FIG. 1, the direction that the device bias-applying layer 160 is magnetized, and the direction that the bias magnetic field-applying layer 156 formed on the back frame-constituting portion for the shield layer is magnetized is in alignment with the same width direction (X-direction). For this reason, such bias layers 160 and 156 can be magnetized integrally and simultaneously, going much in favor of simplified production processes.

Explanation of the Second Embodiment

The second embodiment of the invention is now explained in greater details.

Figure 7:
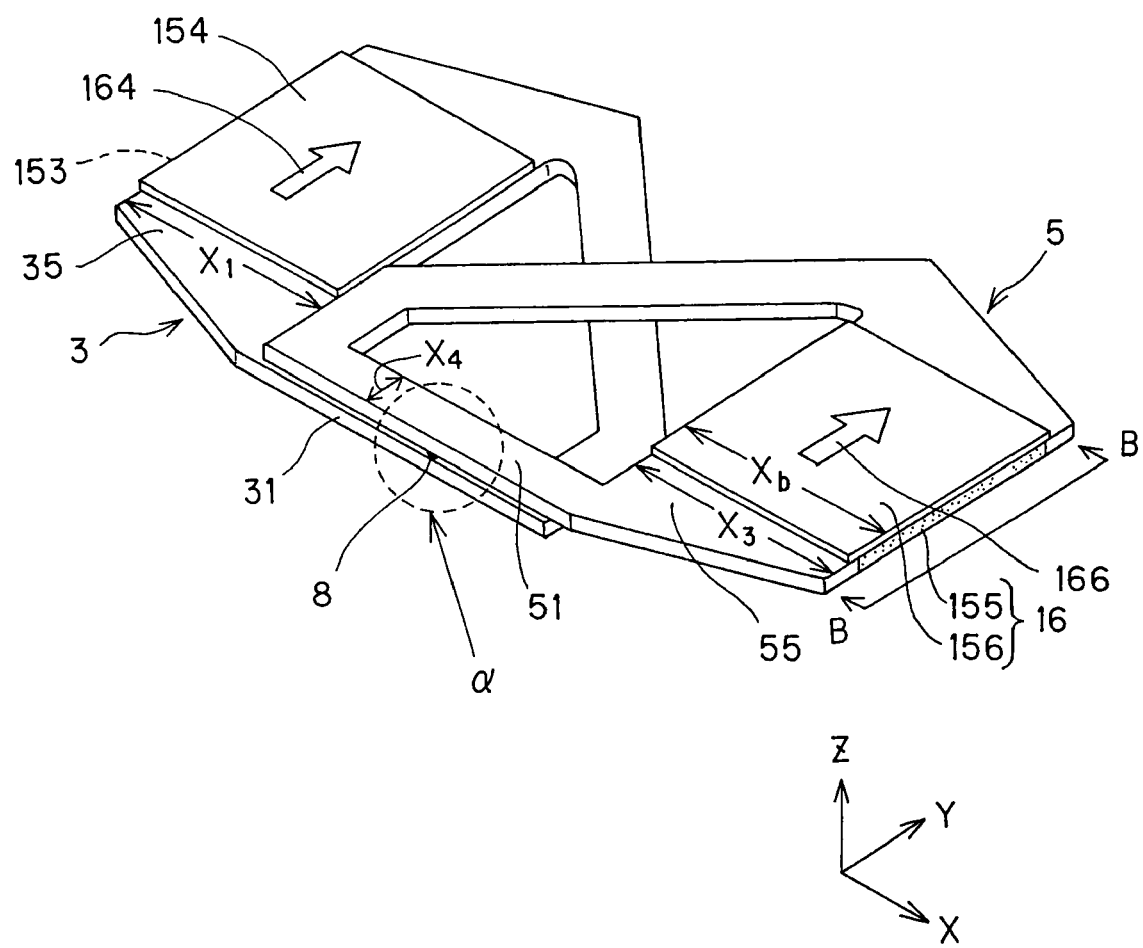
FIG. 7 is illustrative in perspective of the magnetoresistive device according to an embodiment of the invention, as viewed from the ABS (air bearing surface).

FIG. 7 is illustrative in perspective of the magnetoresistive device according to an embodiment of the invention, as viewed from the ABS (air bearing surface) direction. The "ABS" refers to the plane of the device that faces the recording medium (hereinafter also called the medium opposite plane).

Figure 8:
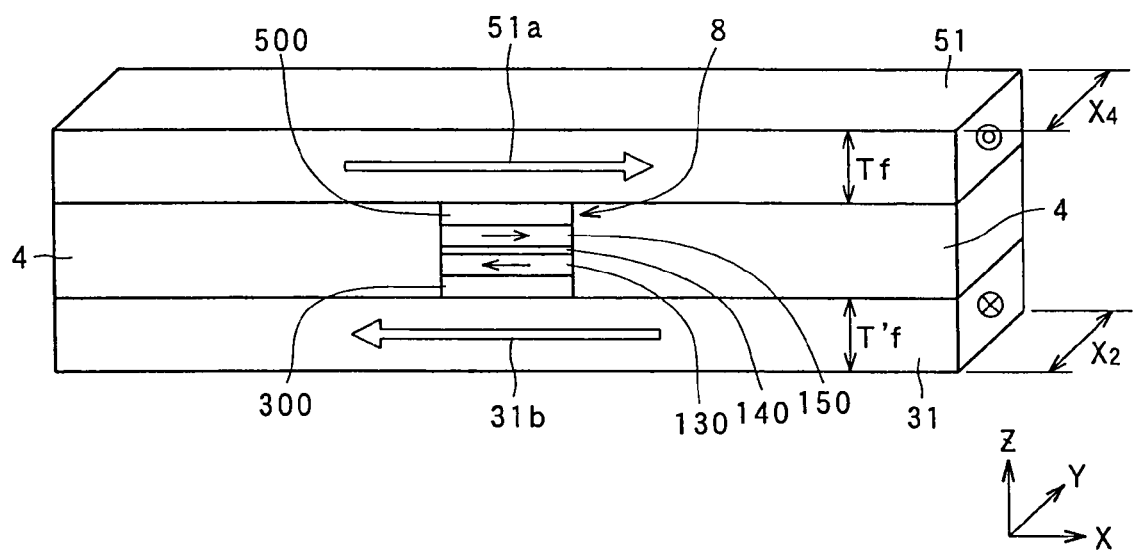
FIG. 8 is illustrative in perspective of the device structure near the ABS of an area a encircled by a dotted line.

FIG. 8 is illustrative in perspective of the device structure of an area α encircled by a dotted line in FIG. 7 and near the ABS.

Figure 9:
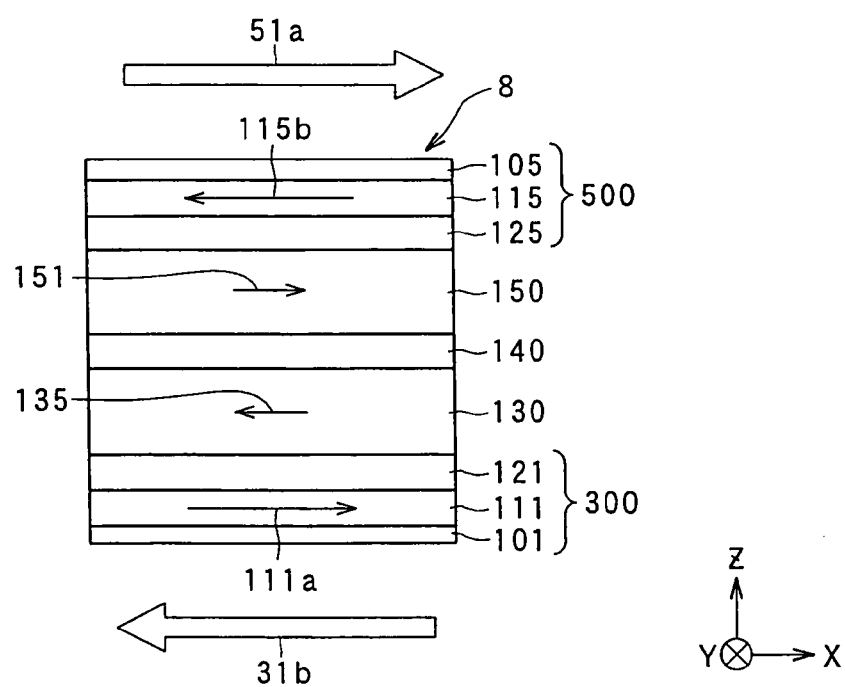
FIG. 9 is an enlarged schematic view of the magnetoresistive unit in the magnetoresistive device of FIG. 8 including a sensor area.

FIG. 9 is an enlarged schematic view of the magnetoresistive unit in the magnetoresistive device of FIG. 8 including a sensor area.

Figure 10:
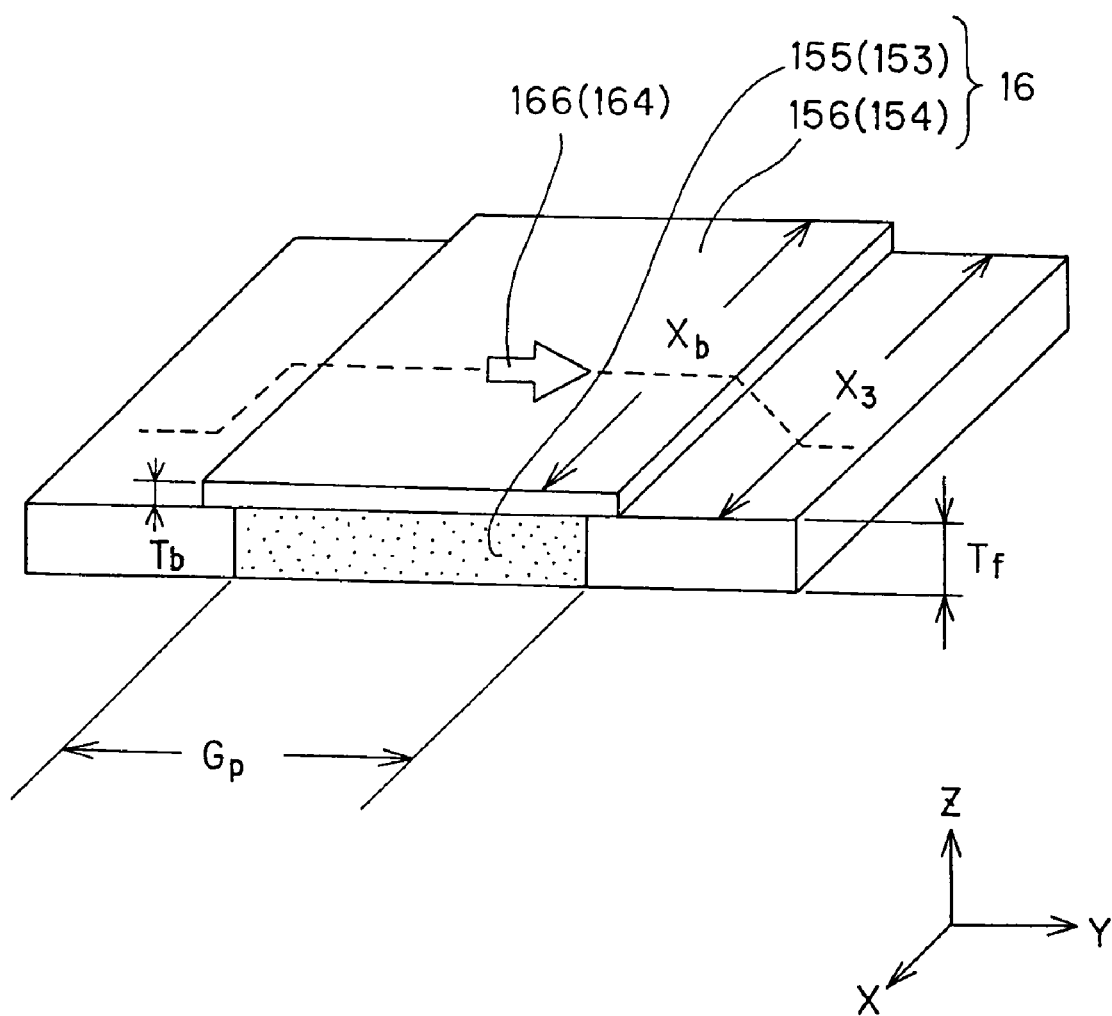
FIG. 10 is a sectional view of FIG. 7 as taken from an arrowed B-B direction.

FIG. 10 is a view of FIG. 7 as viewed from an arrowed B-B direction.

Figure 11:
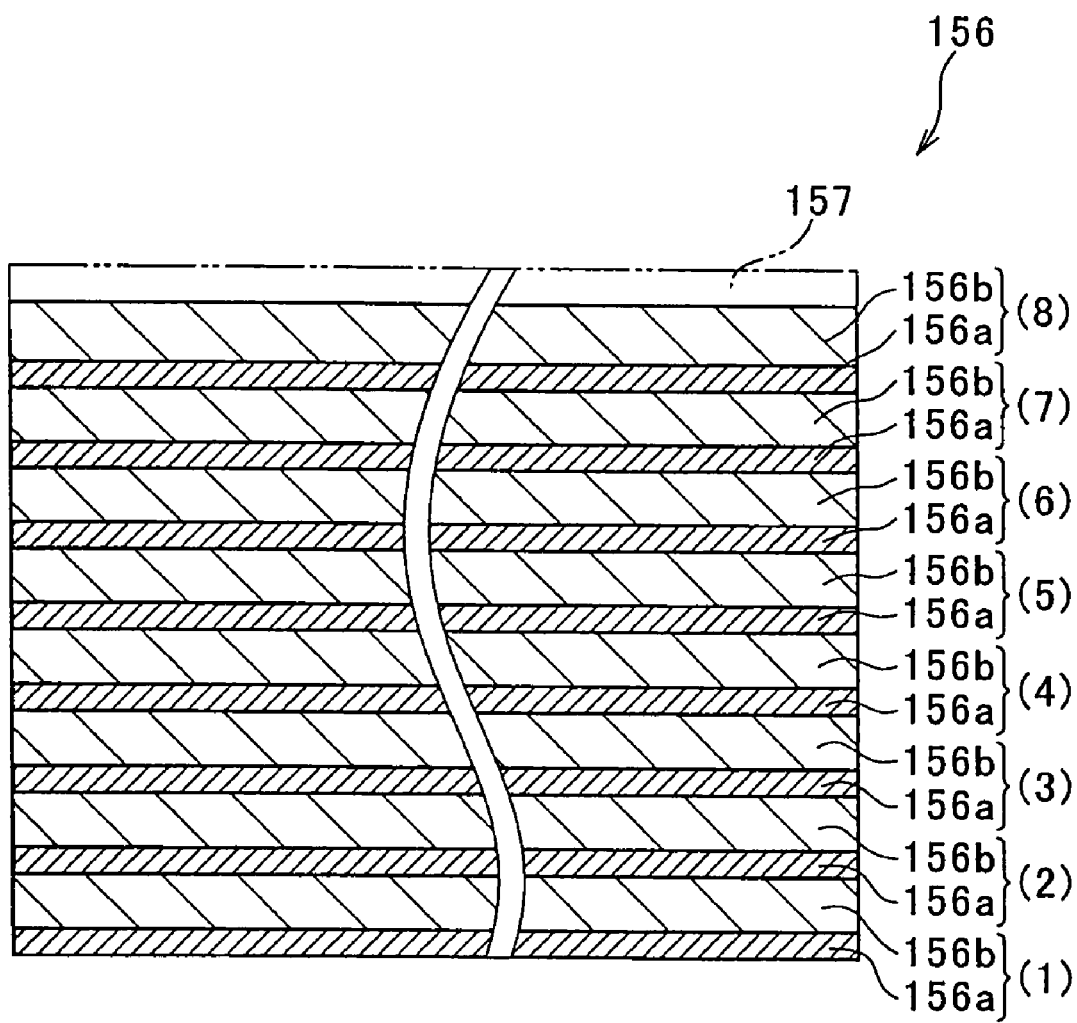
FIG. 11 is illustrative in section of a bias magnetic filed-applying layer that is constructed by repeating the stacking of a multilayer unit eight times, wherein the multilayer unit comprises a nonmagnetic underlay layer and a high-coercive material layer.

FIG. 11 is illustrative in section of the multilayer state of the bias magnetic field-applying layer 156 (154) in FIG. 7.

Figure 12:
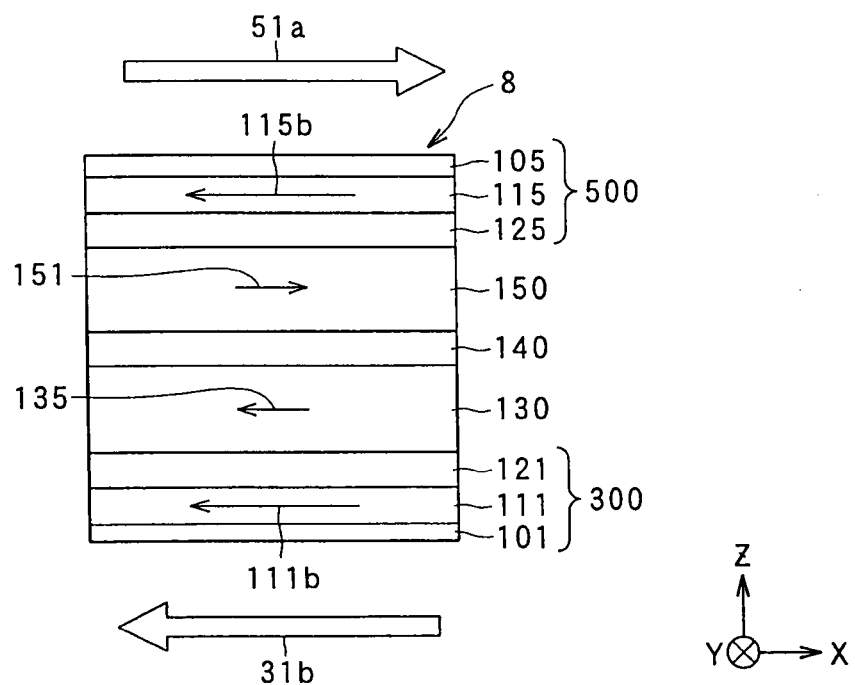
FIG. 12 is illustrative, as in FIG. 9, of a modification to the construction of the magnetoresistive unit.
Figure 13:
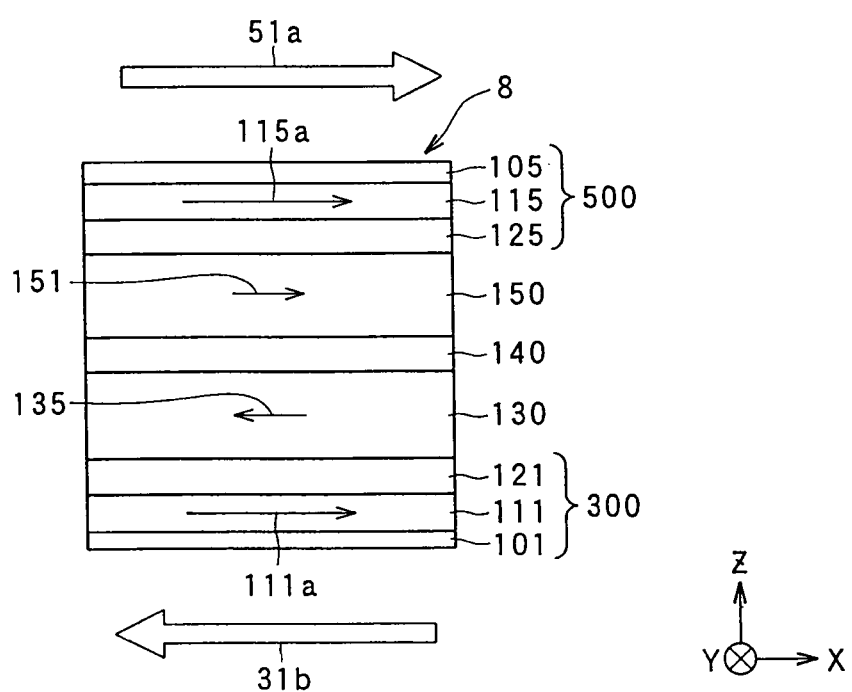
FIG. 13 is illustrative, as in FIG. 9, of another modification to the construction of the mangetoresistive unit.
Figure 14:
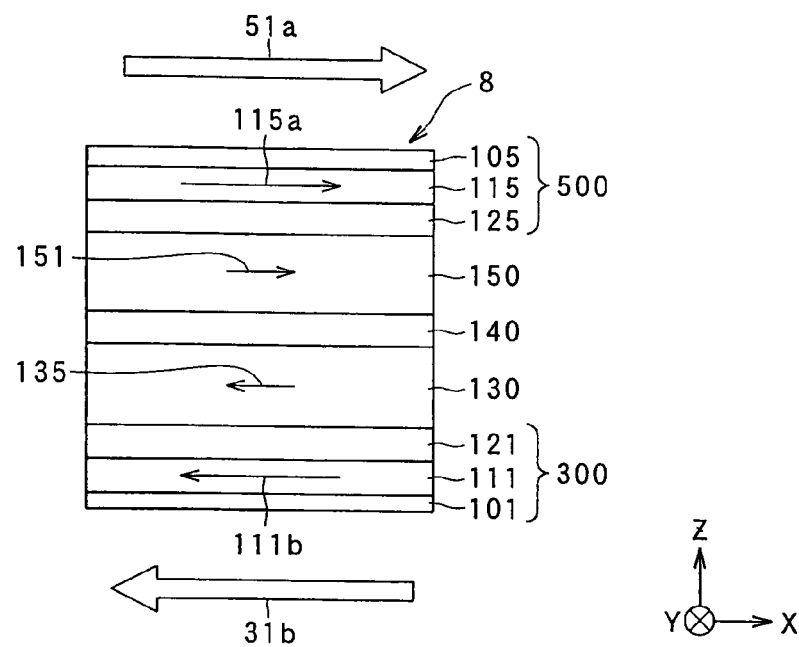
FIG. 14 is illustrative, as in FIG. 9, of yet another modification to the construction of the magnetoresistive unit.

FIGS. 12, 13 and 14 are each illustrative, as in FIG. 9, of modifications to the construction of the magnetoresistive unit.

[Explanation of the Structure of the Magnetoresistive Device]

As shown in FIGS. 7 and 8, the magnetoresistive device of the invention comprises a magnetoresistive unit 8, and a first, substantially soft magnetic shield layer 3 (also called the lower shield layer 3) that is positioned below and a second, substantially soft magnetic shield layer 5 (also called the upper shield layer 5) that is located above wherein those shield layers are located and formed such that the magnetoresistive unit 8 is substantially sandwiched between them from above and below.

And the magnetoresistive device of the invention is a magnetoresistive device of the CPP (current perpendicular to plane) structure with a sense current applied in the stacking direction (Z-direction) of the magnetoresistive unit 8.

As shown in FIG. 8, the magnetoresistive unit 8 comprises a nonmagnetic intermediate layer 140, and a first 130 and a second ferromagnetic layer 150 stacked and formed such that the nonmagnetic intermediate layer 140 is sandwiched between them.

In the invention, the second shield layer 5 positioned above is configured in an endless (continual) framework form having a planar shape (X-Y plane) defined by the width and length directions of the device, as shown in FIG. 7. Likewise in the invention, the first shield layer 3 that is positioned below, too, is configured in an endless (continual) framework form, as is the case with the second shield layer 5. Reference is now made to the second shield layer 5 that is positioned above and the first shield layer 3 that is positioned below.

[Explanation of the Second Shield Layer 5]

As shown in FIG. 7, the framework for the second shield layer 5 that is positioned above comprises a flat plate form of front frame-constituting portion 51 located on a medium opposite plane side (ABS) in front and near where the magnetoresistive unit 8 is positioned and extending in the width (X) direction, and a side frame-constituting portion 55 located at a side position from the end of that front frame-constituting portion 51 (the right side end of FIG. 7) in the rear direction (Y-direction).

As can be seen from what is illustrated in FIG. 7, the width $X_3$ of the side frame-constituting portion 55 is larger than the depth length $X_4$ of the front frame-constituting portion ($X_3 > X_4$). More preferably, the width $X_3$ of the side frame-constituting portion 55 is set 1.4 to 10 times as large as the depth length $X_4$ of the front frame-constituting portion 51.

Why such requirements are in need originates from (1) the relationship between the thickness of a bias magnetic field-applying layer 156 formed on the shield and the thickness of the front frame-constituting portion 51 for the second shield layer 5 formed, and results eventually from (2) the relationship between the total quantity $\phi b$ of a magnetic flux flowing out of the bias magnetic field-applying layer 156 and the saturation quantity $\phi f(s)$ of a magnetic flux for the saturation of the magnetization of the front frame-constituting portion 51 where the magnetoresistive unit 8 is positioned, as will be described later.

As already mentioned, the side frame-constituting portion 55 for the second shield layer 5 partially comprises a combination 16 of a second nonmagnetic gap layer 155 with the second bias magnetic field-applying layer 156, as shown in FIGS. 7 and 10.

It is here noted that for the sake of drawing size and for the purpose of an easy understanding of part of the invention, there is none of the protective layer 157 drawn, which is formed on the uppermost layer of the bias magnetic field-applying layer 156 (also the first bias magnetic field-applying layer 154). For details, see FIG. 11 referred to later.

The second nonmagnetic gap layer 155 is designed and located such that it works to efficiently send a magnetic flux (indicated by 166) given out of the second bias magnetic field-applying layer 156 out to the side of the front frame-constituting portion 51 for the second shield layer 55, and the combination 16 of the second nonmagnetic gap layer 155 with the second bias magnetic field-applying layer 156 is set up in such a way as to form a closed magnetic path with a magnetic flux going all the way around the framework forming the second shield layer 5 (a counterclockwise one in the embodiment illustrated in FIG. 7), and turn into a single domain the magnetization of the front frame-constituting portion 51 for the second shield layer 5 where the magnetoresistive unit 8 is positioned and control the direction of that magnetization.

Other than the combination 16 of the nonmagnetic gap layer 155 with the bias magnetic field-applying layer 156, the second shield layer 5 is made of a high-permeable, soft magnetic material (e.g., permalloy); this is the reason there is the "second, substantially soft magnetic shield layer 5" involved in the invention of this application.

As shown in FIG. 10, the nonmagnetic gap layer 155 is buried in the side frame-constituting portion 55, and the bias magnetic field-applying layer 156 is formed adjacent to that nonmagnetic gap layer 155. In the embodiment shown, the bias magnetic field-applying layer 156 is formed on the nonmagnetic gap layer 155. In the embodiment illustrated, the soft magnetic member of the second shield layer 5 is broken on the way by the nonmagnetic gap layer 155; however, the soft magnetic member of the second shield layer 5 may just as well be broken on the way by the combination 16 of the nonmagnetic gap layer 155 and bias magnetic field-applying layer 156.

First in the invention, the structure of the bias magnetic field-applying layer 156 is of vital importance. As shown in FIG. 11, the bias magnetic field-applying layer 156 is set up by repeating the stacking of a multilayer unit comprising a nonmagnetic underlay layer 156a and a high-coercive material layer 156b at least two times or up to 50 times. In a preferred example shown in FIG. 11, eight multilayer units, each comprising nonmagnetic underlay layer 156a and high-coercive material layer 156b, are stacked up. As the number of stacking of the multilayer unit is below 2, it is difficult for the invention of this application to take effect. As the number of stacking of the multilayer unit is greater than 50, on the other hand, the resulting film thickness gets too thin, tending to give rise to composition mixing with the result that the function of the bias magnetic field-applying layer that it should have is not fully achievable.

As the high-coercive material layer 156b becomes thinner than 8 nm, there is an increasing percentage of rejects. Accordingly, the upper limit to the number of repetitive stacking, N, of the nonmagnetic underlay layer/high-coercive material layer multilayer unit forming the aforesaid bias magnetic field-applying layer could be defined by the integral number part (the disregard of all numbers after the decimal point) of a value obtained by dividing the total thickness X (in nm) of the high-coercive material layers by 8 (in nm). X is in the range of 100 to 400 nm.

The nonmagnetic underlay layer 156a is composed of at least one selected from the group consisting of Cr, CrTi, CrMo, and TiW, and the high-coercive material layer 156b is composed of at least one selected from the group consisting of CoPt, CoCrPt, CoCrTa, CoCrPtTa, and CoNiPt.

A particularly preferred composition of the multilayer unit is Cr/CoPt, Cr/CoCrPt, CrTi/CoPt, and CrTi/CoCrPt.

The nonmagnetic underlay layer 156a should have a thickness of 2 to 15 nm, preferably 3.5 to 10 nm. As that thickness is below 2 nm, there is inconvenience that the high-coercive material layer 156b fails to have any good film quality. As that thickness is greater than 15 nm, on the other hand, the nonmagnetic underlay layer 156a is going to have a thickness than necessary, going unfavorable in terms of economic considerations and failing to make the whole multilayer structure compact.

The high-coercive material layer 156b should have a thickness of 8 to 50 nm. As that thickness is below 8 nm, it becomes too thin, tending to give rise to composition mixing with the result that the function of the high-coercive material layer that it should have is not fully achievable. As that thickness is greater than 50 nm, on the other hand, there are inconveniences that the characteristics of the magnetic film such as rectangularity ratio and coercive force go worse. A decreased coercive force has direct influences on deterioration of magnetic field resistance.

It is here noted that the whole high-coercive material layer 156b should have a total multilayer thickness (total thickness) of about 100 to 400 nm. Referring to FIG. 11 as an example, the total thickness of 8 films 156b should be about 100 to 400 nm.

It is also noted that reference numeral 157 stands for a protective layer for the protection of the bias magnetic field-applying layer 156, which is formed of, for instance, Cr, CrTi, Ta, Ru or the like.

Second in the invention, the action of the nonmagnetic gap layer 155 is of vital importance: it is of much importance to design and locate it such that the magnetic flux given out of the bias magnetic field-applying layer 156 is efficiently sent out to the side of the front frame-constituting portion 51.

For the nonmagnetic gap layer 155, use may be made of an oxide such as alumina or silica; a nitride such as alumina nitride or silicon nitride; and a nonmagnetic metal such as Cr, Ta, NiCr, Au, Cu or the like.

If, in FIG. 10, the nonmagnetic gap layer 155 is removed and instead the soft magnetic member of the second shield layer 5 is used there, then there would be inconvenience that much of the magnetic flux given out of the bias magnetic field-applying layer 156 returns back through the soft magnetic member used there. In other words, it would be impossible to efficiently send the magnetic flux given out of the bias magnetic field-applying layer 156 out to the side of the aforesaid front frame-constituting portion 51.

From such a point of view, the combination 16 of the nonmagnetic gap layer 155 with the bias magnetic field-applying layer 156 here is designed and set up such that there is a closed magnetic path formed with a magnetic flux going all the way around the framework forming the second shield layer 5, and the magnetization of the front frame-constituting portion 51 where the magnetoresistive unit 8 is positioned is turned into a single domain. As shown in FIG. 10, the Y-direction length Gp of the nonmagnetic gap layer 155 is preferably greater than the thickness Tf of the shield film, and the Y-direction length of the bias magnetic field-applying layer 156 is preferably roughly at least 5 times as large as the thickness Tb of the bias magnetic field-applying layer 156. Upper limits to both the Y-direction length Gp of the nonmagnetic gap layer 155 and the Y-direction length of the bias magnetic field-applying layer 156, respectively, are defined by shield shape.

Especially in the invention, to turn into a single domain the magnetization of the front frame-constituting portion 51 where the magnetoresistive unit 8 is positioned, it is desired that the value of $\phi b/\phi f(s)$ be in the range of 0.3 to 2.0, preferably 0.8 to 2.0, where $\phi b$ is the total quantity of the magnetic flux flowing out of the bias magnetic field-applying layer 156 and $\phi f(s)$ is the saturation quantity of the magnetic flux for the saturation of the magnetization of the front frame-constituting portion 51 where the magnetoresistive unit 8 is positioned.

The total quantity $\phi b$ of the magnetic flux flowing out of the bias magnetic field-applying layer 156 is represented in terms of the product of the residual magnetic flux density Brb of the high-coercive material layer 156b forming the bias magnetic field-applying layer 156 and the total sectional area $Sb_{total}$ of the high-coercive material layer 156b forming the bias magnetic field-applying layer 156: $\phi b = Brb \times Sb_{total}$. Note here that the sectional area $Sb_{total}$ is an X-Z plane represented by $Tb \times \epsilon \times$ depth length Xb $(=X_3)$ where $\epsilon$ is the proportion of the thickness Tb shown in FIG. 10 occupied by the high-coercive material layer 156b: $(Sb_{total} = Tb \times \epsilon \times Xb)$.

Usually, the width Xb of the bias magnetic field-applying layer 156 should be the same length as $X_3$ (Xb=$X_3$).

In FIG. 11, it is noted that $\epsilon$ may be represented as (the total sectional area of high-coercive material layer 156b)/[(the total sectional area of high-coercive material layer 156b)+ (the total sectional area of nonmagnetic underlay layer 156a)].

The saturation quantity $\phi f(s)$ of the magnetic flux for the saturation of the magnetization of the front frame-constituting portion 51 where the magnetoresistive unit 8 is positioned is represented in terms of the product of the saturation magnetic flux density Bsf of the material forming the front frame-constituting portion 51 and the sectional area Sf of the front frame-constituting portion 51: $\phi f(s) = Bsf \times Sf$. Note here that the sectional area Sf is a Y-Z plane represented by thickness Tf × depth length $X_2$ shown in FIGS. 7 and 8 (Sf=Tf×$X_4$).

The thickness Tf of the front frame-constituting portion 51 that is the same as the thickness of the second shield layer 5 should usually be 0.5 to 2.0 µm. This is the thickness necessary for letting the shield layer have the so-called magnetic shield function, and that shield layer is formed by the so-called plating.

As already described, the whole high-coercive material layer 156b should have a total multilayer thickness (total thickness) of about 100 to 400 nm. Accordingly, the thickness Tb of the bias magnetic field-applying layer 156 becomes a value obtained by dividing the total multilayer thickness (total thickness) of the whole high-coercive material layer 156b by $\epsilon$. The multilayer films (nonmagnetic underlay layer 156a and high-coercive material layer 156b) forming the bias magnetic field-applying layer 156 are each formed by sputtering.

Given a difference between such film thicknesses Tf and Tb, it is required to meet the aforesaid desirous numerical requirements such that the magnetic flux flowing out of the bias magnetic field-applying layer 156 can get to the front frame-constituting portion 51 where the magnetoresistive unit 8 is positioned, and the magnetic flux necessary for turning the magnetization of the front frame-constituting portion 51 into a single domain is obtainable.

It is noted that one exemplary size for the front frame-constituting portion 51 is $Y_4$=5 µm, Tf=1 µm, and X-direction width=30 µm.

For the substantially soft magnetic material for the second shield layer 5, there is the mention of NiFe (permalloy), CoZrTa, sendust, NiFeCo, CoZrNb, and so on.

[Explanation of the First Shield Layer 3]

It is desired that the first shield layer 3 that is positioned below, too, is configured as is the case with the aforesaid second shield layer 5.

That is, the framework for the first shield layer 3 that is positioned below comprises a flat plate form of front frame-constituting portion 31 located on the medium opposite surface side (ABS) in front and near where the magnetoresistive unit 8 is positioned and extending in the width (X) direction, and a side frame-constituting portion 35 located at a side position from the end of that front frame-constituting portion 31 (the left side end of FIG. 7) in the rear direction (Y-direction), as shown in FIG. 7

The width $X_1$ (see FIG. 7) of the side frame-constituting portion 35 is larger than the depth length $X_2$ (see FIG. 8) of the front frame-constituting portion 31 ($X_1 > X_2$). More preferably, the width $X_1$ of the side frame-constituting portion 35 is set 1.4 to 10 times as large as the depth length $S_2$ of the front frame-constituting portion 31.

It is here noted that the front frame-constituting portion 31 for the first shield layer 3 is difficult to understand because of being shown as overlapping; for the depth length $X_2$, see FIG. 8.

Why such requirements are in need originates from (1) the relationship between the thickness of a bias magnetic field-applying layer 154 formed on the shield and the thickness of the front frame-constituting portion 31 for the first shield layer 3 formed, and results eventually from (2) the relationship between the total quantity φ'b of a magnetic flux flowing out of the bias magnetic field-applying layer 154 and the saturation quantity φ'f(s) of a magnetic flux for the saturation of the magnetization of the front frame-constituting portion 31 where the magnetoresistive unit 8 is positioned, as will be described later.

As already mentioned, the side frame-constituting portion 35 for the first shield layer 3 partially comprises a combination of a first nonmagnetic gap layer 153 with the first bias magnetic field-applying layer 154. The first nonmagnetic gap layer 153 is designed and located such that it works to efficiently send a magnetic flux given out of the first bias magnetic field-applying layer 154 out to the side of the front frame-constituting portion 31 for the first shield layer 3, and the combination of the first nonmagnetic gap layer 153 with the first bias magnetic field-applying layer 154 is set up in such a way as to form a closed magnetic path with a magnetic flux going all the way around the framework forming the first shield layer 3 (a clockwise one in the embodiment illustrated in FIG. 7), and turn into a single domain the magnetization of the front frame-constituting portion 31 for the first shield layer 3 where the magnetoresistive unit 8 is positioned and control the direction of that magnetization.

The construction of the first nonmagnetic gap layer 153 is difficult to understand from what is shown in FIG. 7; to have an understanding of its specific construction, see FIG. 10.

Other than the combination of the nonmagnetic gap layer 153 with the bias magnetic field-applying layer 154, the first shield layer 3 is made of a high-permeable, soft magnetic material; this is the reason there is the "first, substantially soft magnetic shield layer 3" involved in the invention of this application.

The nonmagnetic gap layer 153 is buried in the side frame-constituting portion 35, and the bias magnetic field-applying layer 154 is formed adjacent to that nonmagnetic gap layer 153 (see FIG. 10). The nonmagnetic gap layer 153 may as well be configured and constructed, as in the aforesaid nonmagnetic gap layer 155.

The bias magnetic field-applying layer 154 may just as well be configured and constructed, as in the aforesaid bias magnetic field-applying layer 155 (see FIG. 11).

(Explanation of the Magnetoresistive Unit 8)

As shown in FIG. 8, there is the magnetoresistive unit 8 interposed between the front frame-constituting portion 31 for the first shield layer 3 and the front frame-constituting portion 51 for the second shield layer 5. And on each side of the magnetoresistive unit 8 there is a nonmagnetic layer 4 made of alumina ($Al_2O_3$) or the like located to define the reading track width.

As shown in FIG. 8, the magnetoresistive unit 8 comprises a sensor area positioned at substantially the center of the multilayer film and comprising the first ferromagnetic layer 130, nonmagnetic intermediate layer 140 and second ferromagnetic layer 150, and the first 300 and the second exchange coupling function gap layer 500 that are interposed between that sensor area, and the front frame-constituting portion 31 for the first shield layer 3 and the front frame-constituting portion 51 for the second shield layer 5, respectively.

Between the sensor area and the front frame-constituting portion 31 for the first shield layer 3, and between the sensor area and the front frame-constituting portion 51 for the second shield layer 5, there is a given gap needed corresponding to the recording density. This is to make sure the capturing in the sensor area of only the external magnetic field as signals. As the gap grows larger than necessary, there is a risk of capturing not only the signal magnetic field but also adjacent other signal magnetic fields. Conversely, as the gap is way too smaller than the necessary distance, there is a risk of the signal magnetic field being drawn in the front frame-constituting portions 31 and 51 for the shield layers 3 and 5 surrounding the sensor area rather than in the sensor area.

It goes without saying that the first 300 and the second exchange coupling function gap layer 500 must have such a gap function. Added to this in the invention, the first 300 and the second exchange coupling function gap layer 500 must be made up of such a multilayer structure as explained below for the purpose of letting the key function (characteristic function) of the invention show up.

Explanation of the First Exchange Coupling Function Gap Layer 300

As shown in FIG. 9, the first exchange coupling function gap layer 300 comprises, in order from the side of the front frame-constituting portion 31 for the first shield layer 3, an exchange coupling transfer layer 101, a gap adjustment layer 111 and an exchange coupling adjustment layer 121. The gap adjustment layer 111 is a so-called ferromagnetic layer made of a ferromagnetic material.

The exchange coupling transfer layer 101 is made of at least one material selected from the group consisting of Ru, Rh, Ir, Cr, Cu, Ag, Au, Pt and Pd: it is capable of adjusting the strength of magnetic coupling of the magnetization 31b of the front frame-constituting portion 31 for the first shield layer 3 to the magnetization 111a of the gap adjustment layer 111 depending on what material is selected and what thickness it is set at. As the material to be used is determined and its thickness is set, the direction of the magnetization 111a of the gap adjustment layer 111 magnetically coupled to the magnetization 31b of the front frame-constituting portion 31 for the first shield layer 3 is also determined. To put it another way, whether there is antiferromagnetic coupling (where the magnetizations are magnetically coupled together in opposite directions) or ferromagnetic coupling (where the magnetizations are magnetically coupled together in the same direction) is determined.

The exchange coupling adjustment layer 121 is made of at least one material selected from the group consisting of Ru, Rh, Ir, Cr, Cu, Ag, Au, Pt and Pd: it is capable of adjusting the strength of magnetic coupling of the magnetization 111a of the gap adjustment layer 111 to the magnetization 135 of the first ferromagnetic layer 130 depending on what material is selected and what thickness it is set at. As the material to be used is determined and its thickness is set, the direction of the magnetization 135 of the first ferromagnetic layer 130 magnetically coupled to the magnetization 111a of the gap adjustment layer 111 is also determined. To put it another way, whether there is antiferromagnetic coupling or ferromagnetic coupling is determined.

The requirement for the invention is that the first ferromagnetic layer 130 functions as the so-called free layer that responds to the external magnetic field with high sensitivity. To this end, the first ferromagnetic layer 130 is set such that the strength of magnetic coupling of the magnetization 31b of the front frame-constituting portion 31 for the first shield layer 3 to the magnetization 111a of the gap adjustment layer 111 grows strong, and the strength of the magnetization 111a of the gap adjustment layer 111 to the magnetization 135 of the first ferromagnetic layer 130 gets relatively weak.

The first exchange coupling function gap 300 has a thickness set at about 1.5 to 6.0 nm.

Explanation of the Second Exchange Coupling Function Gap Layer 500

As shown in FIG. 9, the second exchange coupling function gap layer 500 comprises, in order from the side of the front frame-constituting portion 51 for the second shield layer 5, an exchange coupling transfer layer 105, a gap adjustment layer 115 and an exchange coupling adjustment layer 125. The gap adjustment layer 115 is a so-called ferromagnetic layer made of a ferromagnetic material.

The exchange coupling transfer layer 105 is made up of at least one material selected from the group consisting of Ru, Rh, Ir, Cr, Cu, Ag, Au, Pt and Pd: it is capable of adjusting the strength of magnetic coupling of the magnetization 51a of the front frame-constituting portion 51 for the second shield layer 5 to the magnetization 115b of the gap adjustment layer 115 depending on what material is selected and what thickness it is set at. As the material to be used is determined and its thickness is set, the direction of the magnetization 115b of the gap adjustment layer 115 magnetically coupled to the magnetization 51a of the front frame-constituting portion 51 for the second shield layer 5 is also determined. To put it another way, whether there is antiferromagnetic coupling (where the magnetizations are magnetically coupled together in opposite directions) or ferromagnetic coupling (where the magnetizations are magnetically coupled together in the same direction) is determined.

The exchange coupling adjustment layer 125 is made of at least one material selected from the group consisting of Ru, Rh, Ir, Cr, Cu, Ag, Au, Pt and Pd: it is capable of adjusting the strength of magnetic coupling of the magnetization 115b of the gap adjustment layer 115 to the magnetization 151 of the second ferromagnetic layer 150 depending on what material is selected and what thickness it is set at. As the material to be used is determined and its thickness is set, the direction of the magnetization 151 of the second ferromagnetic layer 150 magnetically coupled to the magnetization 115b of the gap adjustment layer 115 is also determined. To put it another way, whether there is antiferromagnetic coupling or ferromagnetic coupling is determined.

The requirement for the invention is that the second ferromagnetic layer 150 functions as the so-called free layer that responds to the external magnetic field with high sensitivity. To this end, the second ferromagnetic layer 150 is set such that the strength of magnetic coupling of the magnetization 51a of the front frame-constituting portion 51 for the second shield layer 5 to the magnetization 115b of the gap adjustment layer 115 grows strong, and the strength of the magnetization 115b of the gap adjustment layer 115 to the magnetization 151 of the second ferromagnetic layer 150 gets relatively weak.

The second exchange coupling function gap 500 has a thickness set at about 1.5 to 6.0 nm.

Explanation of the Adjustment of the Strength of Magnetic Coupling (the Strength of the Exchange Coupled Magnetic Field)

The adjustment of the strength of magnetic coupling (the strength of the exchange coupled magnetic field) is now explained with reference to FIGS. 17 and 18.

Figure 17:
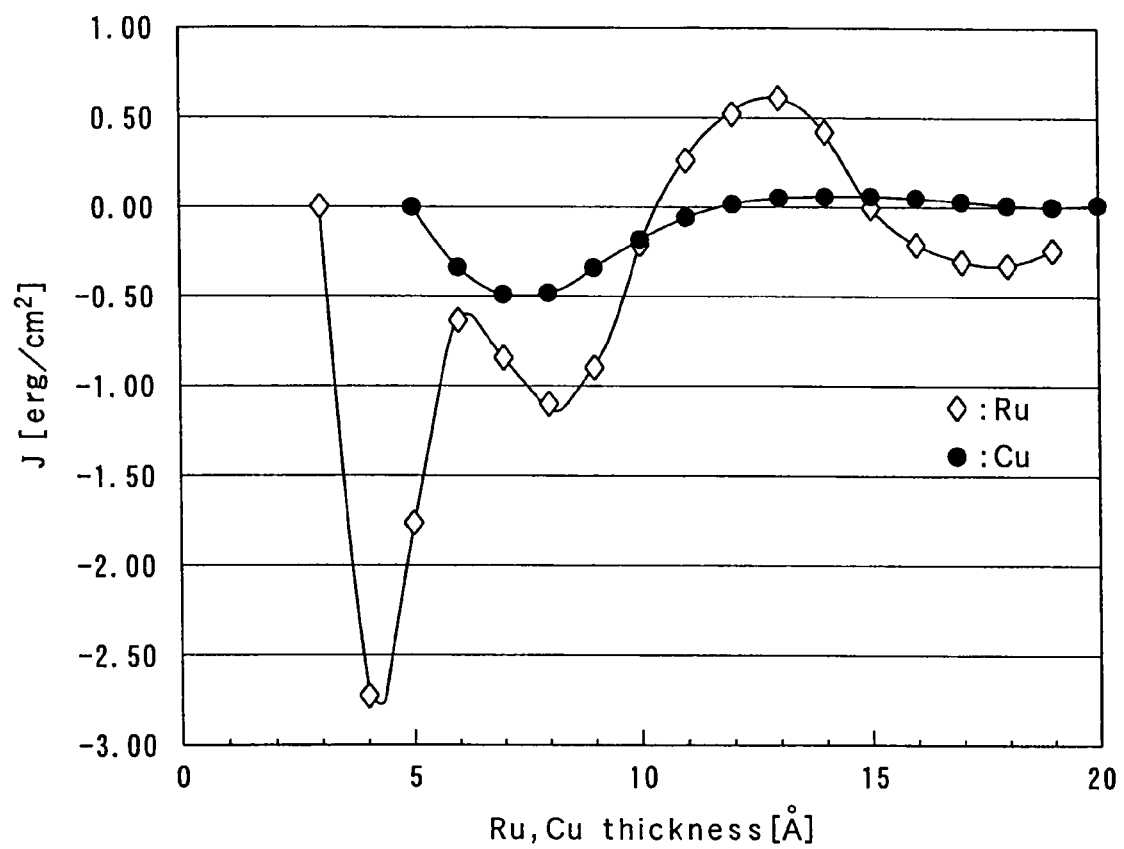
FIG. 17 is a graph indicative of the thickness t (Å) of Ru and Cu vs. the exchange coupled magnetic field strength J (erg/cm$^2$) in the event that Ru and Cu are used as the materials to form the exchange coupling transfer layer 101, 105 and the exchange coupling adjustment layer 121, 125.

FIG. 17 is a graph indicative of the thickness t (Å) of Ru, and Cu vs. the exchange coupled magnetic field strength J (erg/cm$^2$) in the event that Ru, and Cu is used for the material forming the exchange coupling transfer layer 101, 105 and the exchange coupling adjustment layer 121, 125. This graph has been prepared using a $Co_{90}Fe_{10}$ alloy for the magnetic material subjected to exchange coupling with Ru or Cu held in place. FIG. 18 is a graph indicative of the Cu thickness t (Å) vs. the exchange coupled magnetic field strength J (erg/cm$^2$): it is basically and substantially the same as the graph of FIG. 17 concerning Cu. In particular, however, the scale span for the exchange coupled magnetic field strength J (erg/cm$^2$) indicated on ordinate is enlarged for an easy understanding of fluctuations on ordinate.

Figure 18:
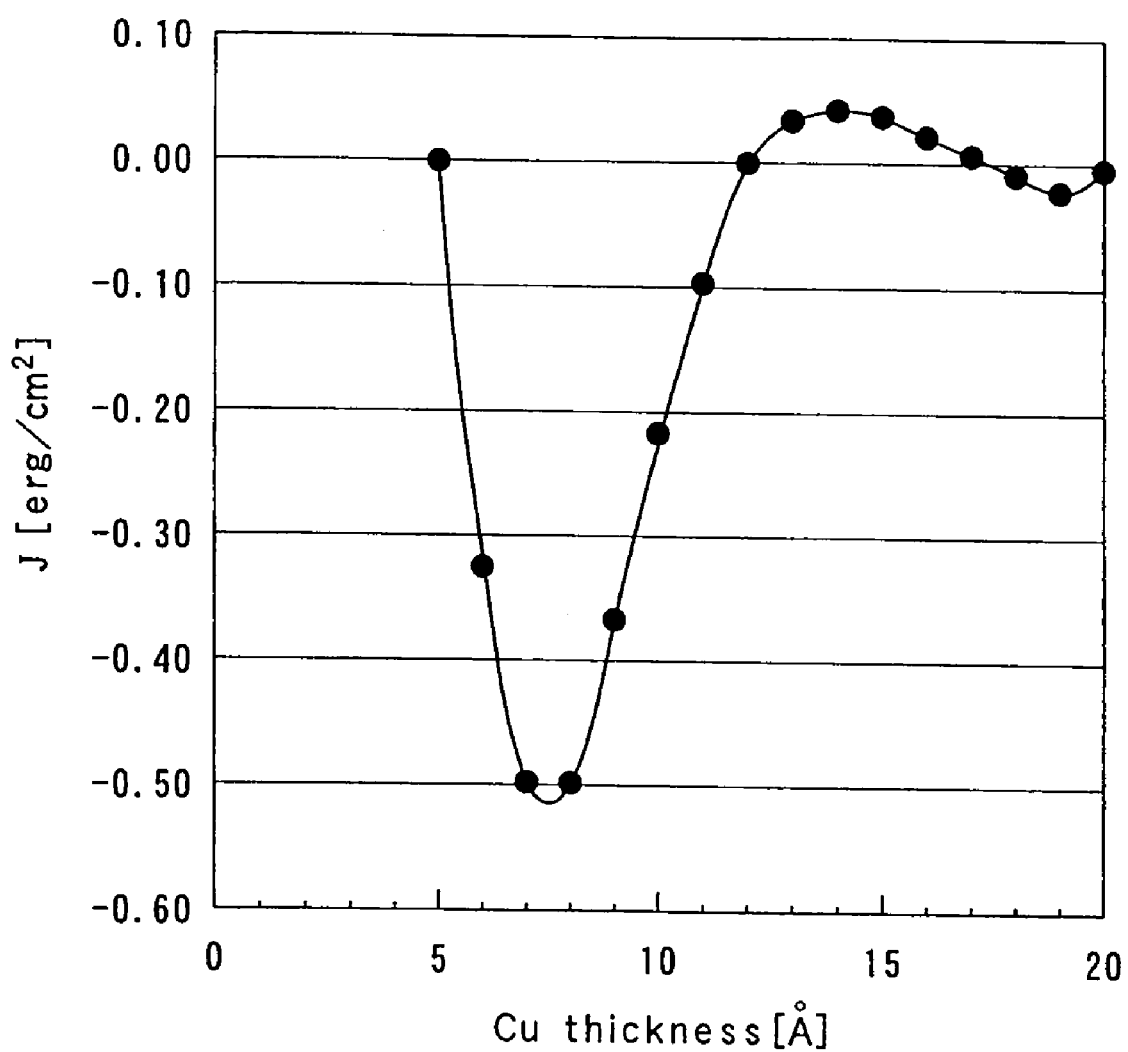
FIG. 18 is a graph indicative of the Cu thickness t (Å) vs. the exchange coupled magnetic filed strength J (erg/cm$^2$).

In the graphs of FIGS. 17 and 18, when the value of the exchange coupled magnetic field strength J (erg/cm$^2$) is plus (+), there is the so-called ferromagnetic coupling taking place (where magnetic coupling occurs with magnetizations in the same direction). In contrast, when the value of the exchange coupled magnetic field strength J (erg/cm$^2$) is minus (−), there is the antiferromagnetic coupling taking place (where magnetic coupling occurs with magnetizations in the same direction).

The absolute value |J| of the exchange coupled magnetic filed strength J (erg/cm$^2$) is indicative of the absolute quantity of the coupled strength itself.

Preferably, the exchange coupling transfer layer 101, 105 should be designed such that the absolute value |J| of the exchange coupled magnetic field strength J (erg/cm$^2$) is greater than 0.2 (erg/cm$^2$): |J|>0.2 (erg/cm$^2$). As the absolute value |J| of the exchange coupled magnetic field strength J (erg/cm$^2$) is below 0.2 (erg/cm$^2$), it causes the magnetizations 111a and 115b of the gap adjustment layers 111 and 115 to fluctuate under the influences of a magnetic field from the medium, resulting in inconvenience that they may otherwise function as shields.

With these considerations in mind, it is herein desired that (1) when Cu is used for the exchange coupling transfer layer 101, 105, the thickness of Cu be set in the range of 6 to 10 Å, and (2) when Ru is used for the exchange coupling transfer layer 101, 105, the thickness of Ru be set in the ranges of 4 to 9 Å and 16 to 20 Å, as can be seen from the graphs of FIGS. 17 and 18.

In contrast, the exchange coupling adjustment layer 121, 125 is preferably designed such that the absolute value |J| of the exchange coupled magnetic field strength J (erg/cm$^2$) is greater than 0.02 (erg/cm$^2$) but less than 0.6 (erg/cm$^2$): 0.02<|J|<0.6 (erg/cm$^2$). As the absolute value |J| of the exchange coupled magnetic field strength J (erg/cm$^2$) is below 0.02 (erg/cm$^2$), it causes the magnetization state of the first and second ferromagnetic layers 130 and 150 functioning as the free layers to come to have a multiple domain structure, resulting in inconvenience of giving rise to Barkhausen noises. As the absolute value |J| of the exchange coupled magnetic field strength J (erg/cm$^2$) is greater than 0.6 (erg/cm$^2$), it causes the magnetizations of the first and second ferro-magnetic layers 130 and 150 functioning as the free layers to be incapable of freely responding to a signal magnetic field from the medium, resulting in inconvenience that may otherwise lead to sensitivity drops.

With these considerations in mind, it is herein desired that (1) when Cu is used for the exchange coupling adjustment layer 121, 125, the thickness of Cu be set in the range of 13 to 16 Å, and (2) when Ru is used for the exchange coupling adjustment layer 121, 125, the thickness of Ru be set in the range of 9.5 to 20 Å, as can be seen from the graphs of FIGS. 17 and 18.

It is noted that even when Rh, Ir, Cr, Ag, Au, Pt, and Pd is used as the material to form the exchange coupling transfer layer 101, 105 and the exchange coupling adjustment layer 121, 125, the thickness of one each may be set as is the case with Ru, and Cu.

Explanation of the Sensor Area Comprising the First Ferro-Magnetic Layer 130, the Nonmagnetic Intermediate Layer 140, and the Second Ferromagnetic Layer 150

As already referred to, the sensor area is defined by the multilayer structure comprising the first ferro-magnetic layer 130, the nonmagnetic intermediate layer 140 and the second ferromagnetic layer 150, and the total thickness of that multilayer structure is about 10 to 20 nm. Of these layers, the first 130 and the second ferromagnetic layer 150 function as the so-called free layers, one each having the direction of magnetization changing under the influences of an externally applied magnetic field.

For instance, the first 130, and the second ferromagnetic layer 150 is made of a material such as NiFe, CoFe, CoFeB, CoFeNi, $Co_2MnSi$, $Co_2MnGe$, and $FeO_x$ (the oxide of Fe), and has a thickness of about 0.5 to 8 nm.

The nonmagnetic intermediate layer 140 is the film essentially required to let the MR effect show up, and is typically made of Cu, Au, Ag, Zn, Ga, $TiO_x$, ZnO, InO, SnO, GaN, ITO (indium tin oxide), $Al_2O_3$, and MgO. In a preferable embodiment, the nonmagnetic intermediate layer 140 is formed of a multilayer structure comprising two or more layers, for instance, a triple-layer structure film of Cu/ZnO/Cu. A triple-layer structure film of Cu/ZnO/Zn with Cu replaced by Zn is also preferable because of boosted-up output.

The nonmagnetic intermediate layer 140 has a thickness of about 0.5 to 5 nm.

(Explanation of One Modification to the Magnetoresistive Device)

FIGS. 12, 13 and 14 are illustrative, as in FIG. 9, of modifications to the construction of the magnetoresistive unit 8.

Commonly in any case, the first ferromagnetic layer 130 and the second ferromagnetic layer 150, one each functioning as the free layer, receive such action that there is an antiparallel magnetization state created, where their magnetizations are in opposite directions, under the influences of magnetic actions from the front frame-constituting portions 31 and 51 for the first shield layer 3 and the second shield layer 5, respectively. What is different is whether antiferromagnetic coupling or ferromagnetic coupling is to be used depending on the material and thickness specifications of the exchange coupling transfer layer 101, 105 and the exchange coupling adjustment layer 121, 125.

Figure 15:
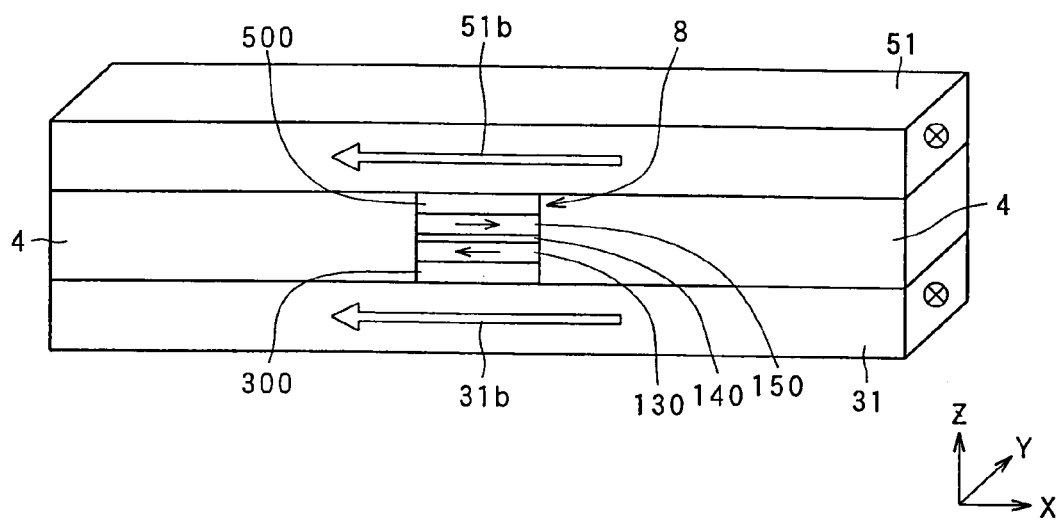
FIG. 15 is illustrative in perspective, as in FIG. 9, of the magnetoresistive device according to another embodiment of the invention, as viewed from the ABS (air bearing surface).
Figure 16:
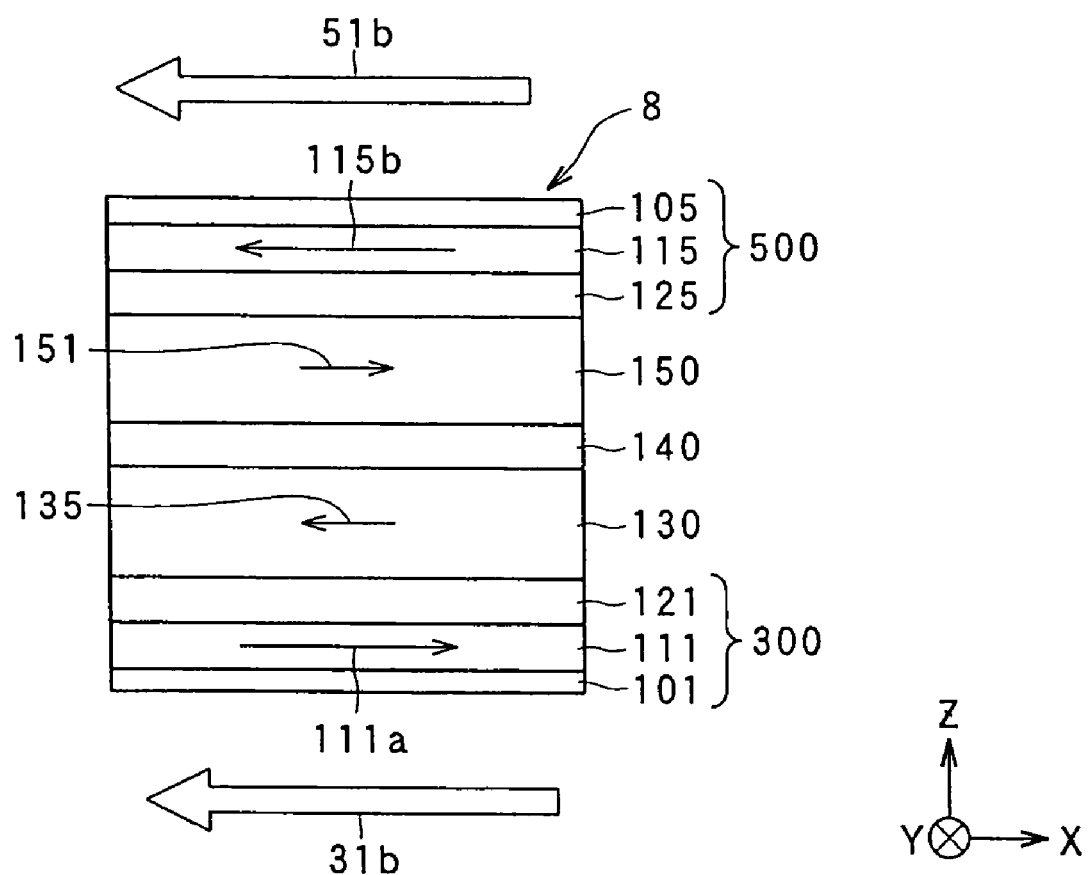
FIG. 16 is an enlarged schematic view of the magnetoresistive unit in the magnetoresistive device of FIG. 15 including a sensor area.

FIG. 15 is a perspective view of the magnetoresistive device according to another embodiment of the invention, as viewed from the ABS (air bearing surface). FIG. 16 is an enlarged schematic view of the magnetoresistive unit of the magnetoresistive device of FIG. 15 including the sensor area.

In the embodiment shown in FIG. 15, the front frame-constituting portion 31 for the first shield layer 3 has its magnetization fixed in the minus width direction (−X direction) from the right to the left side of the paper. Likewise, the front frame-constituting portion 51 for the second shield layer 5 has its magnetization fixed in the minus width direction (−X direction) from the right to the left side of the paper, too.

In this modified embodiment, too, the first 130 and the second ferromagnetic layer 150, one each functioning as the free layer, receive such action that there is an antiparallel magnetization state created, where their magnetizations are in opposite directions, under the influences of magnetic actions from the front frame-constituting portions 31 and 51 for the first shield layer 3 and the second shield layer 5, respectively. The exchange coupling transfer layer 101, 105, and the exchange coupling adjustment layer 121, 125 can make use of either antiferromagnetic coupling or ferromagnetic coupling depending on what material is used and what thickness it is set at.

Figure 19:
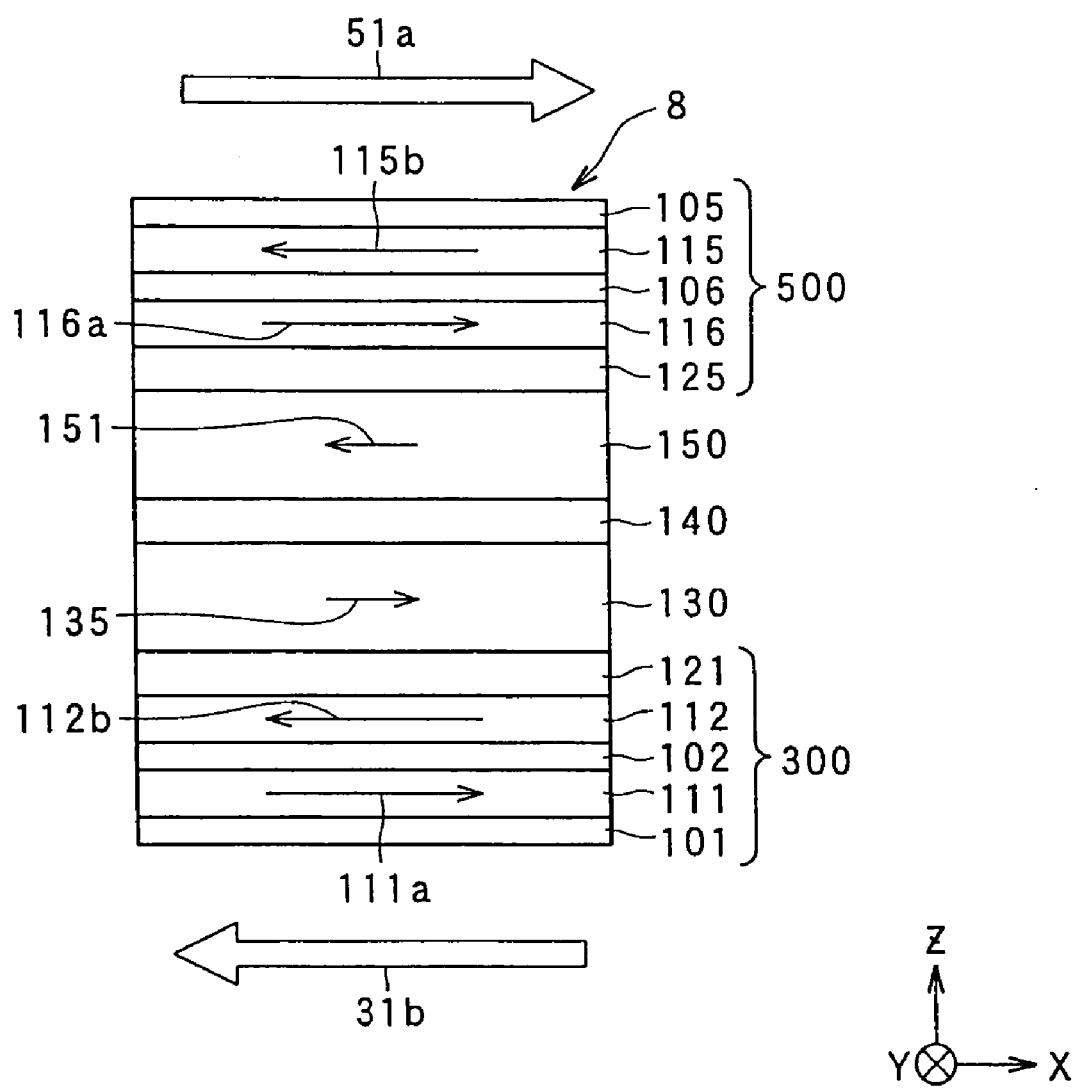
FIG. 19 is illustrative in section of another modification to the construction of the magnetoresistive unit.

FIG. 19 is illustrative of another modification to the magnetoresistive unit 8. This modification is different from the aforesaid magnetoresistive unit 8 in terms of the construction of the first exchange coupling function gap layer 300, and the construction of the second exchange coupling function gap layer 500. That is, in FIG. 19, the first exchange coupling function gap layer 300 comprises, in order from the side of the front frame-constituting portion 31 for the first shield layer 3, an exchange coupling transfer layer 101, a gap adjustment layer 111, an exchange coupling transfer layer 102, a gap adjustment layer 112, and an exchange coupling adjustment layer 121. On the other hand, the second exchange coupling function gap layer 500 comprises, in order from the side of the front frame-constituting portion 51 for the second shield layer 5, an exchange coupling transfer layer 105, a gap adjustment layer 115, an exchange coupling transfer layer 106, a gap adjustment layer 116, and an exchange coupling adjustment layer 125. In this embodiment, too, the construction of each of the layers described as the exchange coupling transfer layer, gap adjustment layer and exchange coupling adjustment layer is the same as that of each of the exchange coupling transfer layer, gap adjustment layer and exchange coupling adjustment layer shown in FIGS. 9 and 12-14.

In the embodiment shown in FIG. 19, by (1) making strong antiferromagnetic coupling between two ferromagnetic layers, say, the gap adjustment layers 111 and 112 while both have the matching quantity of magnetization Mst, and (2) making strong antiferromagnetic coupling between two ferromagnetic layers, say, the gap adjustment layers 115 and 116 while both have the matching quantity of magnetization Mst, it is possible to reduce responses to the external magnetic field down to zero, thereby achieving more preferable advantages. Even when the coupling strength of the exchange coupling transfer layer is relatively weak, it is possible to make sure it has also a gap layer function. In the construction shown in FIG. 19, it is noted that the third peak of Ru may be used as the exchange coupling adjustment layer.

[Explanation of Another Modification to the Magneto-Resistive Device]

Figure 22:
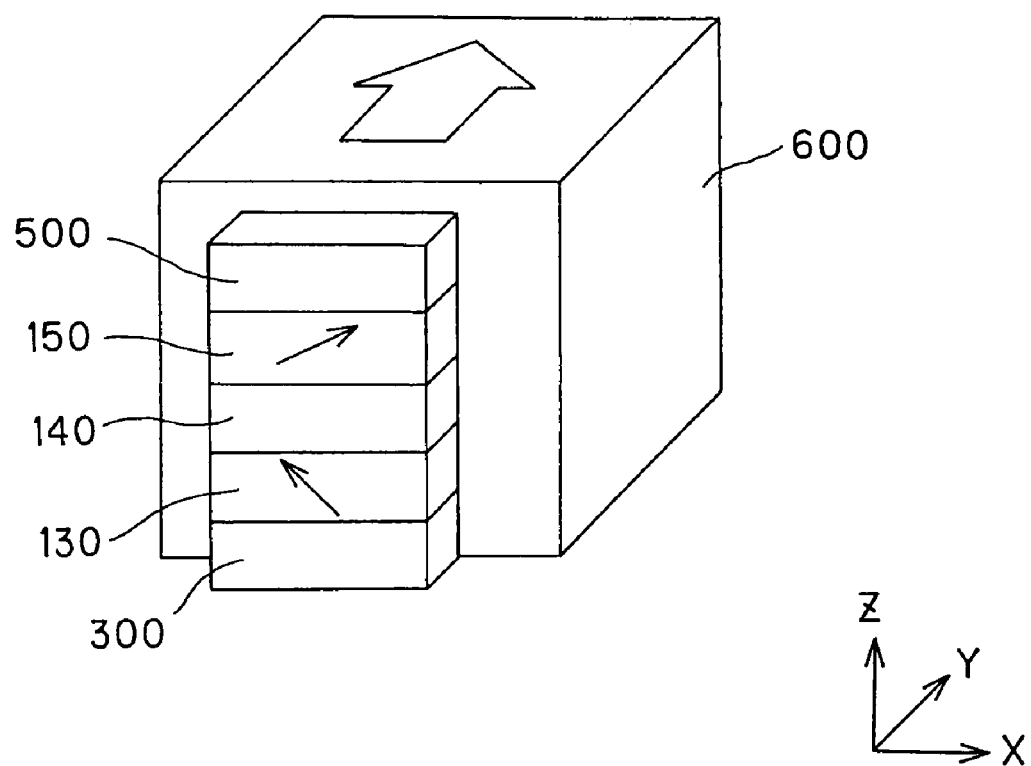
FIG. 22 is a model illustrative in perspective of a device bias magnetic field-applying means (device bias-applying layer) located at the rear (depth side: Y-direction) of the first, and the second ferromagnetic layer.

The structure or embodiment of such a magnetoresistive device as shown in FIG. 7 also performs better in that the bias magnetic field-applying layer 154, 156 (FIG. 7) and a device bias magnetic field-applying means (device bias-applying layer) 600 to be described later (FIG. 22) can be magnetized integrally and simultaneously.

Figure 20:
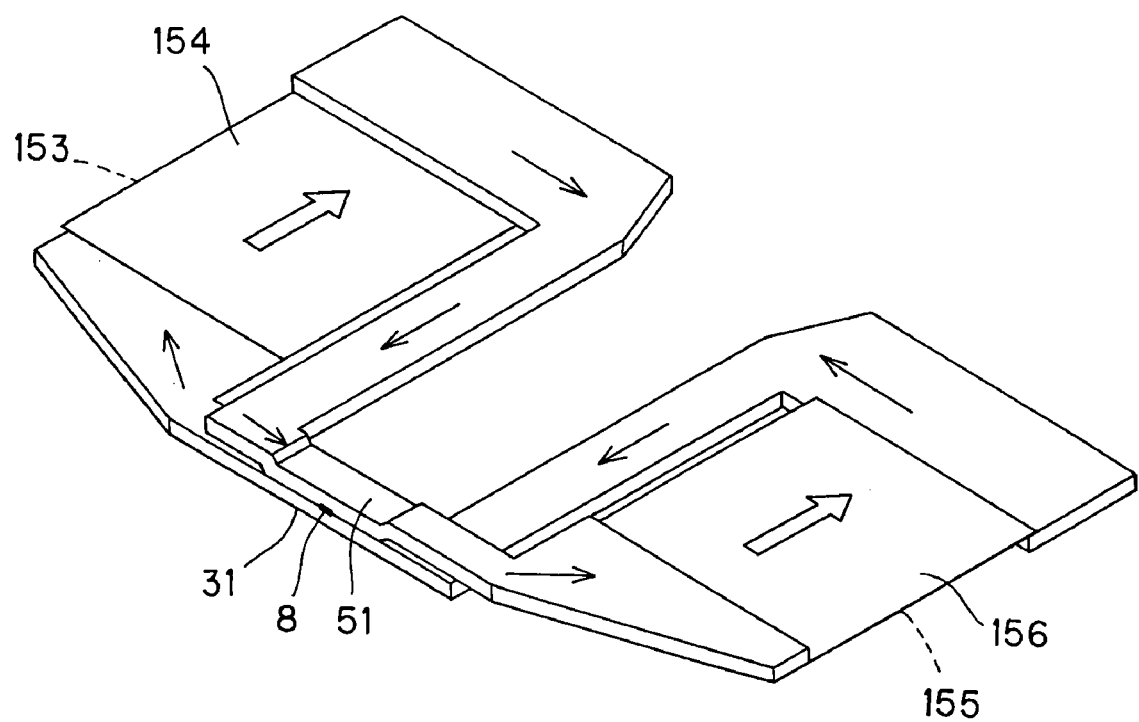
FIG. 20 is illustrative in perspective of the magnetoresistive device according to yet another embodiment of the invention, as viewed from the ABS (air bearing surface).

Further, the two shield layers or the first 3 and the second shield layer 5 shown in FIG. 7 may be formed as an integral piece with a continual or uninterrupted magnetic path, as shown in FIG. 20, rather than as separate members. Note here that for the sake of drawing size and for an easy understanding of part of the invention, there is none of the protective layer 157 drawn in FIG. 20, which is formed on the uppermost layer of the second bias magnetic field-applying 156 (also the first bias magnetic field-applying layer 154). For details, see what is illustrated in the aforesaid FIG. 4 or FIG. 11.

Two such first 3 or second shield layers 5 as shown in FIG. 7 may be located above and below. In this case, when the two bias magnetic field-applying layers are magnetized in the same Y-direction, the front frame-constituting portions 31, 51 for the first 3 and the second shield layer 5 are placed in magnetic field directions 31b, 51b, as shown in FIG. 15.

FIG. 23 is illustrative of a sort of an embodiment rather than a modification, wherein there is a change in the means for applying magnetization to the shields. Specifically, FIG. 23 is a perspective view of the magnetoresistive device according to another embodiment of the invention, as viewed from the ABS (air bearing surface) direction. The framework for the first 3', and the second shield layer 5' shown in FIG. 23 comprises a front frame-constituting portion 31', 51' located on the side opposite to the medium opposite plane in front and near where the magnetoresistive unit is positioned. Further, a coil 154', 156' is wound around a part of the framework for the aforesaid first, and the aforesaid second shield layer so that by a magnetic flux generated by passing currents through that coil 154', 156', the magnetization of the front frame-constituting portion 31', 51' for the aforesaid first, and second shield layer is turned into a single domain and the direction of that magnetization is controlled. Note here that by an appropriate choice of the direction of currents passing through the coil 154', 156' (current application direction), the direction of magnetization of the front frame-constituting portion 31', 51' for the first, and the second shield layer may be changed.

[Explanation of the Operation of the Magnetoresistive Device of Detecting the External Magnetic Field]

Figure 21A:
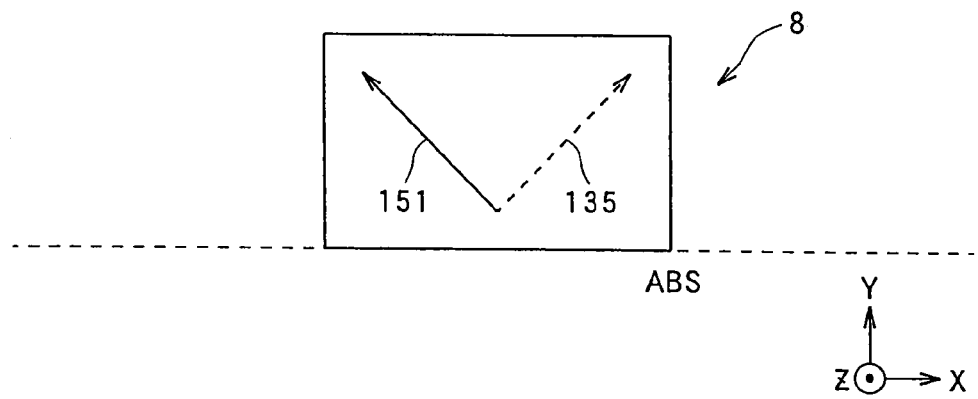
FIGS. 21A, 21B and 21C are models indicative of external magnetic field-depending changes in the state of magnetization where changes in the magnetoresistive effect of the inventive magnetoresistive device are obtainable.

The operation of the magnetoresistive device of the invention of detecting an external magnetic field is now explained with reference to FIGS. 21A, 21B and 21C.

Before the application of a bias magnetic field for placing magnetizations in the orthogonal directions, the first 130 and the second ferromagnetic layer 150 are each in an antiparallel magnetization state where their magnetizations are in opposite directions under the influences of the magnetic actions of the front frame-constituting portions 31 and 51 for the first 3 and the second shield layer 5, respectively.

Usually, through a bias magnetic field-applying means (device bias-applying layer) 600 such as a hard magnet located at the rear (the depth side: Y-direction) of the first 130 and the second ferromagnetic layer 150, a bias magnetic field is applied to the first 130 and the second ferromagnetic layer 150 so that the magnetizations 135 and 151 of the first 130 and the second ferromagnetic layer 150 are placed in substantially orthogonal directions, creating such a state as shown in FIG. 21A. This state defines the initial state of the magnetoresistive device (the magnetoresistive unit 8).

Figure 21B:
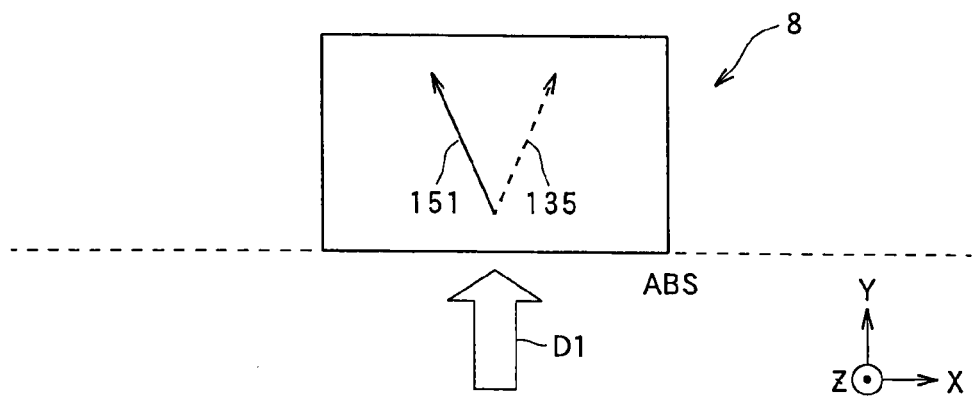

As an external magnetic field D1 flowing from the ABS into the device side is detected as shown in FIG. 21B, both the magnetizations 135 and 151 of the first 130 and the second ferromagnetic layer 150 tend to lie in the same direction so that the resistance of the device grows low.

Figure 21C:
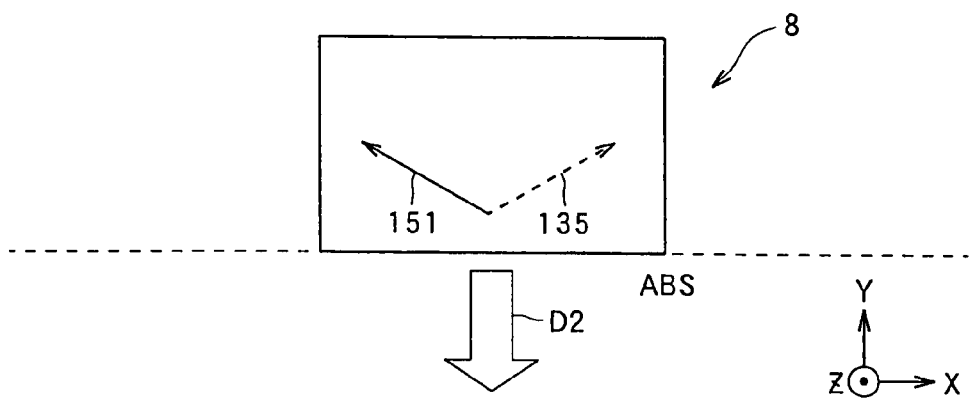

On the other hand, as an external magnetic field D2 in a direction away from the ABS is detected as shown in FIG. 21C, the magnetizations 135 and 151 of the first 130 and the second ferromagnetic layer 150 tend to lie in opposite directions so that the resistance of the device grows high.

By measuring such a series of resistance changes with the external magnetic field, it is possible to detect the external magnetic field.

It is here noted that by letting the magnetoresistive device have such structure as shown in FIG. 7, the bias magnetic field-applying layers 154, 156 (FIG. 7) and the device bias magnetic field-applying means (device bias-applying layer) 600 (FIG. 22) can be magnetized integrally and simultaneously in the same magnetization direction (Y-direction) so that the magnetization step can be simplified with improvements in the reliability of magnetization.

[Explanation of the Whole Structure of the Thin-Film Magnetic Head]

Figure 24:
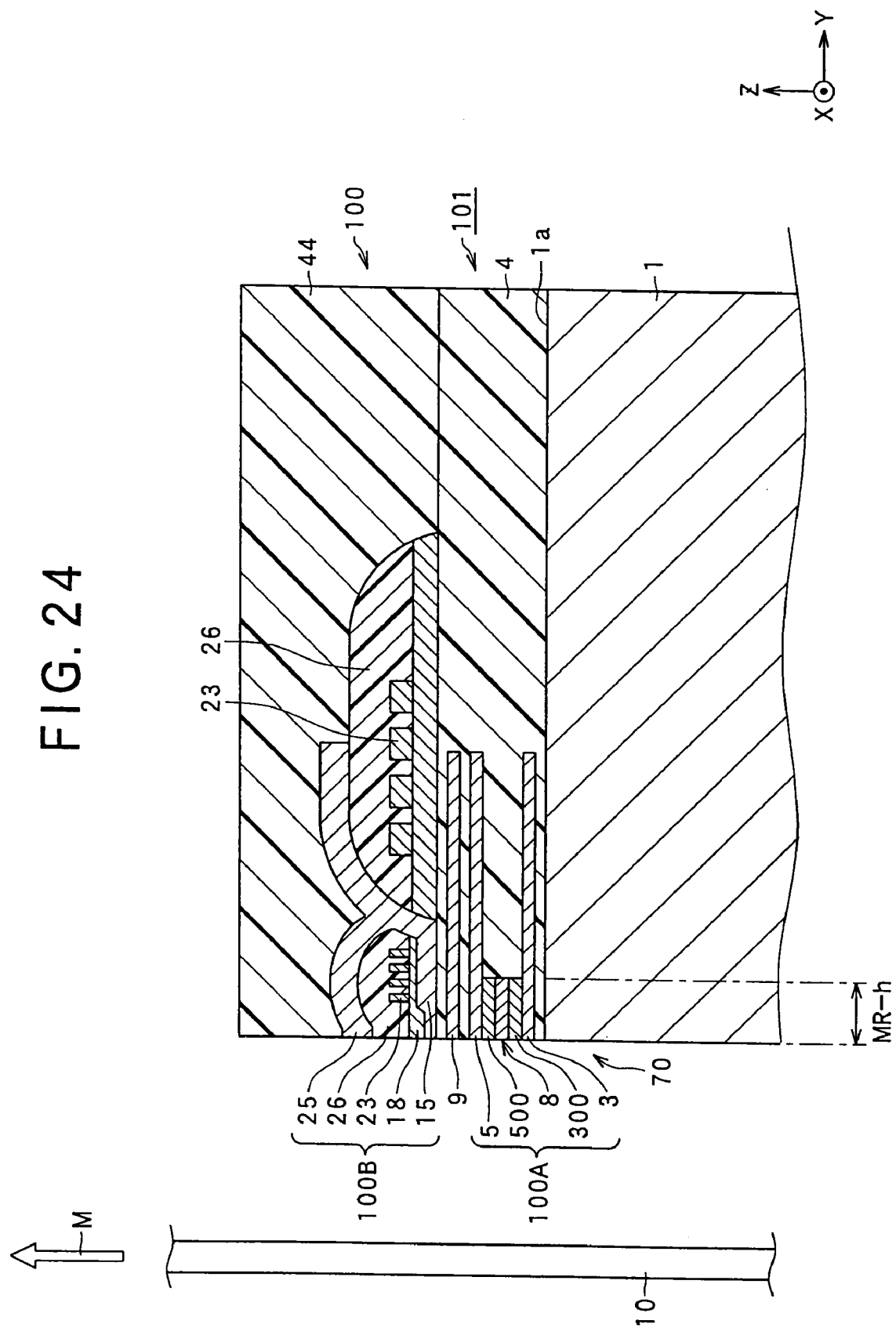
FIG. 24 is illustrative in section of the thin-film magnetic head parallel with the so-called air bearing surface (ABS).

FIG. 24 is illustrative in section (section in the Y-Z plane) of a thin-film magnetic head parallel with the so-called air bearing surface (ABS).

A thin-film magnetic head 100 shown in FIG. 24 is used on a magnetic recording system such as a hard disk drive for the purpose of applying magnetic processing to a recording medium 10 like a hard disk moving in a medium travel direction M.

The thin-film magnetic head 100 illustrated in the drawing is a composite type head capable of implementing both recording and reproducing as magnetic processing. The structure comprises, as shown in FIG. 24, a slider substrate 1 made of a ceramic material such as AlTiC ($Al_2O_3.TiC$), and a magnetic head unit 101 formed on the slider substrate 1.

The magnetic head unit 101 has a multilayer structure comprising a reproducing head portion 100A adapted to implement reproducing process for magnetic information recorded by making use of the magnetoresistive (MR) effect and a shield type recording head portion 100B adapted to implement, for instance, a perpendicular recording type recording processing.

A detailed account is now given below.

A first shield layer 3 and a second shield layer 5 are each a planar layer formed in such a way as to be almost parallel with the side 1a of the slider substrate 1, forming a part of the ABS that is a medium opposite plane 70.

A magnetoresistive unit 8 is disposed in such a way as to be held between the first 3 and the second shield layer 5, forming a part of the medium opposite plane 70. And a height in the perpendicular direction (Y-direction) to the medium opposite plane 70 defines an MR height (MR-h).

For instance, the first 3 and the second shield layer 5 are each formed by pattern plating inclusive of frame plating or the like. Although not clearly illustrated in the drawing, it is understood that the first 3 and the second shield layer 5 must be set up in such a way as to produce the aforesaid advantages of the invention.

The magnetoresistive unit 8 is a multilayer film formed in such a way as to be almost parallel with the side 1a of the slider substrate 1, forming a part of the medium opposite plane 70.

The magnetoresistive unit 8 is a multilayer film of the current-perpendicular-to-plane type (CPP type) with a sense current passing in the direction perpendicular to the staking plane: it is constructed as already described.

As shown in FIG. 24, between the second shield layer 5 and the recording head portion 100B there is an inter-device shield layer 9 formed that is made of a similar material to that of the second shield layer 5.

The inter-device shield layer 9 keeps the magnetoresistive unit 8 functioning as a sensor out of a magnetic field occurring from the recording head 100B, taking a role in prevention of extraneous noises upon reading. Between the inter-device shield layer 9 and the recording head portion 100B there may also be a backing coil portion formed. The backing coil portion is to generate a magnetic flux that cancels out a magnetic flux loop that is generated from the recording head portion 100B, passing through the upper and lower electrode layers of the magnetoresistive unit 8: this backing coil portion works to hold back the wide adjacent track erasure (WATE) phenomenon that is unwanted writing or erasure operation with the magnetic disk.

At a gap between the first and second shield layers 3 and 5 on the side of the magnetoresistive unit 8 that faces away from the medium opposite plane 70, at the rear of the first and second shield layers 3, 5 and the inter-device shield layer 9 that face away from the medium opposite plane 70, at a gap between the first shield layer 3 and the slider substrate 1, and at a gap between the inter-device shield layer 9 and the recording head portion 100B, there are insulating layers 4 and 44 formed, one each made of alumina or the like.

The recording head portion 100B is preferably constructed for the purpose of perpendicular magnetic recording, and comprises a main magnetic pole layer 15, a gap layer 18, a coil insulating layer 26, a coil layer 23 and an auxiliary magnetic pole layer 25, as shown in FIG. 16.

The main magnetic pole layer 15 is set up as a magnetic guide path for guiding a magnetic flux induced by the coil layer 23 to the recording layer of the magnetic recording medium 10 with information being to be written on it while converging that magnetic flux. At the end of the main magnetic pole layer 15 here that is on the medium opposite plane 70 side, the width in the track width direction (along the X-axis of FIG. 24) and thickness in the stacking direction (along the Z-axis of FIG. 24) of the main magnetic pole layer should preferably be less than those of the rest. Consequently, it is possible to generate a fine yet strong writing magnetic flux well fit for high recording densities.

The end on the medium opposite plane 70 side of the auxiliary magnetic pole layer 25 magnetically coupled to the main magnetic pole layer 15 forms a trailing shield portion having a layer section wider than that of the rest of the auxiliary magnetic pole layer 25. As shown in FIG. 24, the auxiliary magnetic pole layer 25 is opposed to the end of the main magnetic pole layer 15 on the medium opposite plane 70 side while the gap layer 18 made of an insulating material such as alumina and the coil insulating layer 26 are interposed between them.

By the provision of such auxiliary magnetic pole layer 25, it is possible to make steeper a magnetic field gradient between the auxiliary magnetic pole layer 25 and the main magnetic pole layer 15 near the medium opposite plane 70. Consequently, jitters of signal outputs diminish, resulting in the ability to minimize error rates upon reading.

The auxiliary magnetic pole layer 25, for instance, is formed at a thickness of, e.g., about 0.5 to 5 μm using frame plating, sputtering or the like. The material used may be an alloy comprising two or three of, for instance, Ni, Fe and Co, or comprising them as a main component with the addition of given elements to it.

The gap layer 18 is formed in such a way as to space the coil layer 23 away from the main magnetic pole layer 15. The gap layer 18 is constructed from $Al_2O_3$, DLC (diamond-like carbon) or the like having a thickness of, for instance, about 0.01 to 0.5 μm, and formed using, for instance, sputtering, CVD or the like.

[Explanation of the Head Gimbal Assembly and the Hard Disk System]

Each one example of the head gimbal assembly and the hard disk system, used with the foregoing thin-film head mounted on it, is now explained.

A slider 210 included in the head gimbal assembly is first explained with reference to FIG. 25. In the hard disk system, the slider 210 is located in such a way as to face a hard disk that is a rotationally driven disk-form recording medium. This slider 210 primarily comprises a substrate 211 built up of a substrate and an overcoat.

The substrate 211 is in a generally hexahedral shape. Of the six surfaces of the substrate 211, one surface is in opposition to the hard disk. On that one surface there is the air bearing plane 30 formed.

Figure 25:
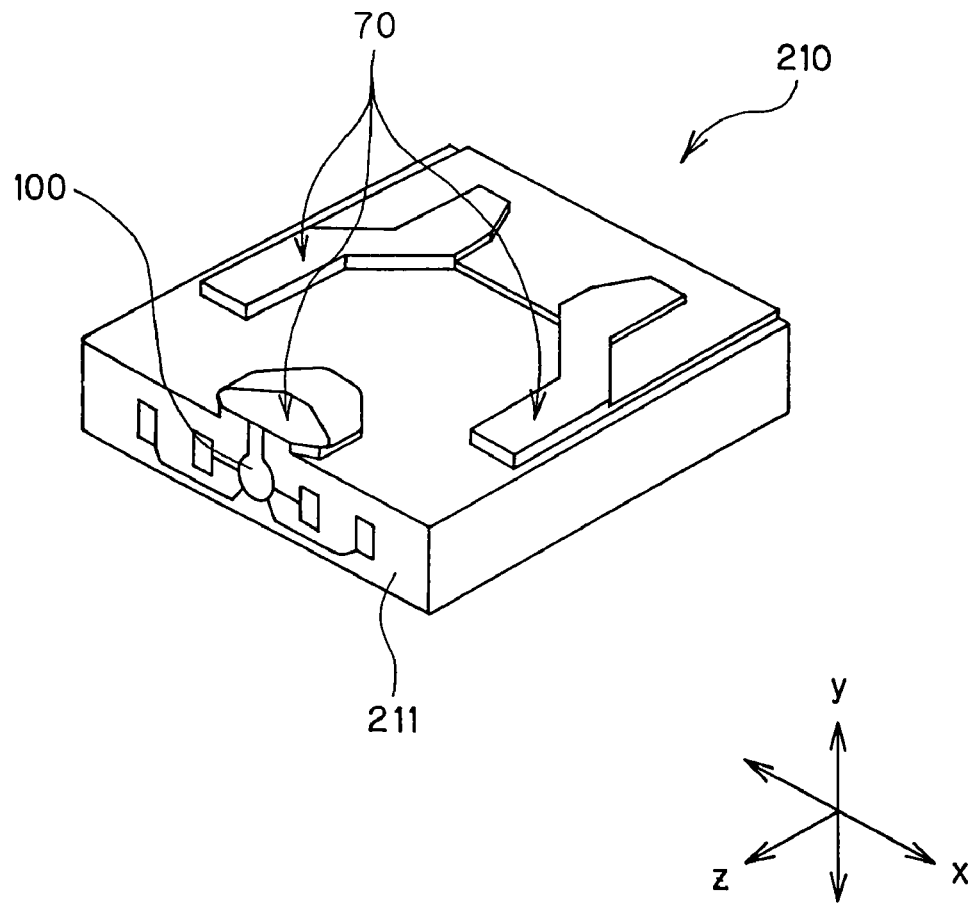
FIG. 25 is illustrative in perspective of the slider included in the head gimbal assembly according to one embodiment of the invention.

As the hard disk rotates in the z-direction in FIG. 25, it causes an air flow passing between the hard disk and the slider 210 to induce lift relative to the slider 210 in the downward y-direction in FIG. 25. This lift in turn causes the slider 210 to levitate over the surface of the hard disk. Note here that the x-direction in FIG. 25 traverses tracks on the hard disk.

Near the end of the slider 210 on an air exit side (the left lower end in FIG. 25), there is a thin-film magnetic head formed according to the embodiment here.

A head gimbal assembly 220 according to this embodiment is now explained with reference to FIG. 26. The head gimbal assembly 220 comprises a slider 210 and a suspension 221 adapted to resiliently support that slider 210. The suspension 221 comprises a leaf spring-form load beam 222 made of typically stainless steel, a flexure 223 attached to one end of the load beam 222 and having the slider 210 joined to it for giving a suitable degree of flexibility to the slider 210, and a base plate 224 attached to the other end of the load beam 222.

The base plate 224 is adapted to be attached to an arm 230 of an actuator for moving the slider 210 in the track traverse direction x of the hard disk 262. The actuator comprises the arm 230 and a voice coil motor for driving that arm 230. At a portion of the flexure 223 having the slider 210 attached to it, there is a gimbal portion provided for keeping the posture of the slider 210 constant.

The head gimbal assembly 220 is attached to the arm 230 of the actuator. The head gimbal assembly 220 attached to one arm 230 is called a head arm assembly, whereas the head gimbal assembly 220 attached to a carriage at its plurality of arms is referred to as a head stack assembly.

Figure 26:
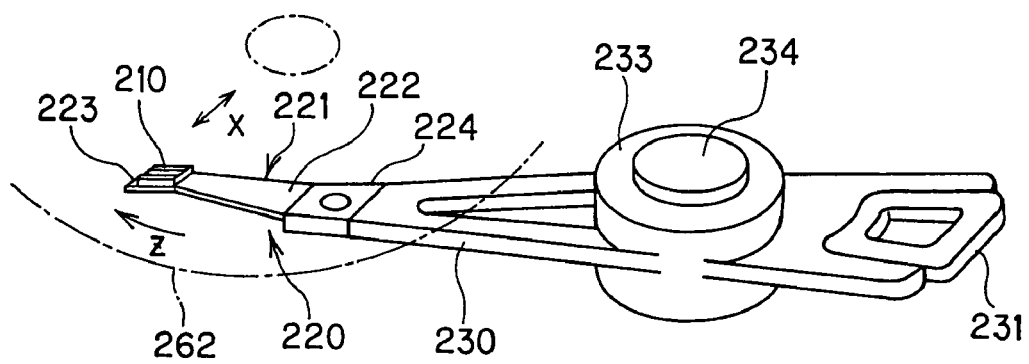
FIG. 26 is illustrative in perspective of the head arm assembly comprising the head gimbal assembly according to one embodiment of the invention.

FIG. 26 illustrates one example of the head arm assembly, wherein the head gimbal assembly 220 is attached to one end of the arm 230. To the other end of the arm 230, a coil 231 forming a part of the voice coil motor is attached. Halfway across the arm 230, there is a bearing portion 233 attached to a shaft 234 adapted to support the arm 230 in a pivotal fashion.

Each one example of the head stack assembly and the hard disk system according to the embodiment here are now explained with reference to FIGS. 27 and 28.

Figure 27:
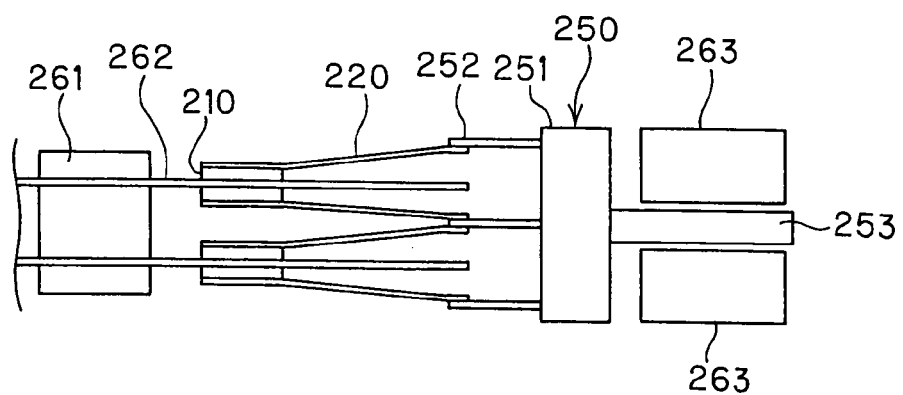
FIG. 27 is illustrative of part of the hard disk system according to one embodiment of the invention.
Figure 28:
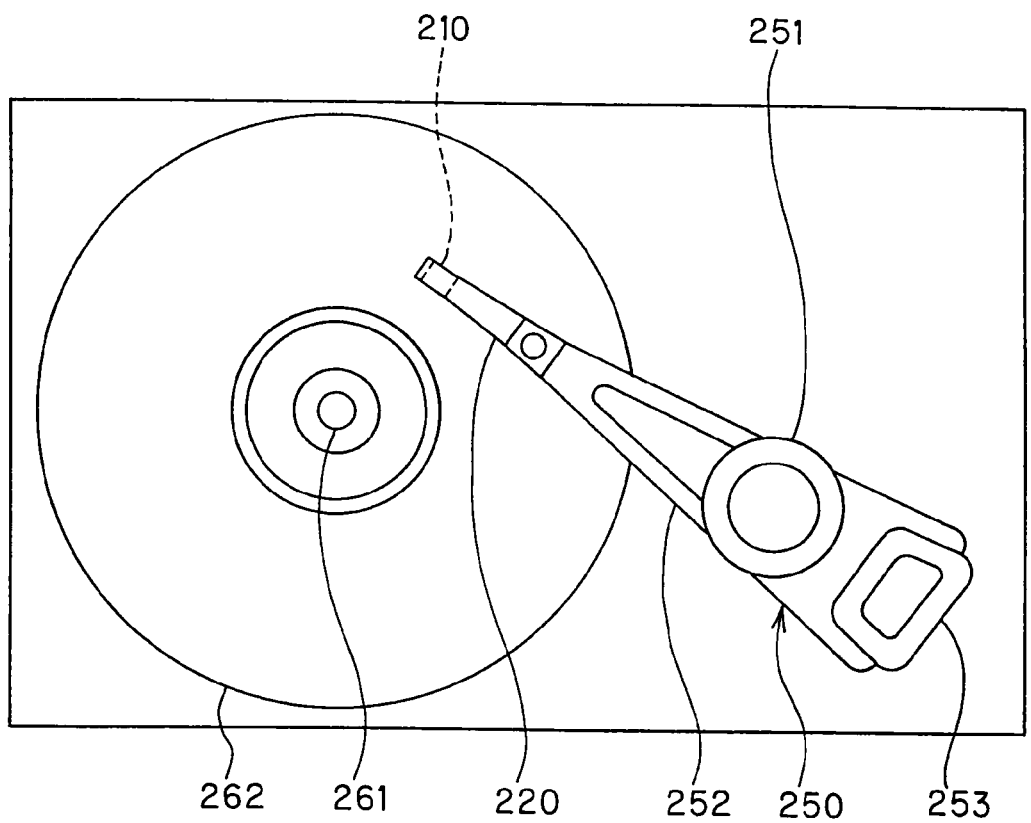
FIG. 28 is a plan view of the hard disk system according to one embodiment of the invention.

FIG. 27 is illustrative of part of the hard disk system, and FIG. 28 is a plan view of the hard disk system.

A head stack assembly 250 comprises a carriage 251 having a plurality of arms 252. The plurality of arms 252 are provided with a plurality of the head gimbal assemblies 220 such that they line up perpendicularly at an interval. On the side of the carriage 251 that faces away from the arms 252, there is a coil 253 attached, which coil becomes a part of the voice coil motor. The head stack assembly 250 is incorporated in the hard disk system.

The hard disk system comprises a plurality of hard disks 262 attached to a spindle motor 261. For each hard disk 262, two sliders 210 are located such that they are opposite to each other with the hard disk 262 held between them. The voice coil motor has also permanent magnets 263 located at opposite positions with the coil 253 of the head stack assembly 250 held between them.

The head stack assembly 250 except the slider 210 and the actuator correspond to the positioning device here which is operable to support the slider 210 and position it relative to the hard disk 262.

With the hard disk system here, the actuator is actuated to move the slider 210 in the track traverse direction of the hard disk 262, thereby positioning the slider 210 with respect to the hard disk 262. The thin-film magnetic head incorporated in the slider 210 works such that information is recorded by a recording head in the hard disk 262, and the information recorded in the hard disk 262 is played back by a reproducing head.

The head gimbal assembly and the hard disk system here have pretty much the same action as the thin-film magnetic head according to the foregoing embodiment.

While the embodiment here has been described with reference to the thin-film magnetic head of the structure wherein the reproducing head portion is located on the substrate side and the perpendicular recording head portion is stacked on the reproducing head, it is contemplated that that order of stacking could be reversed. When the thin-film magnetic head here is used as a read-only head, the recording head could be removed from it.

SPECIFIC EXPERIMENTS

The magnetoresistive device of the invention is now explained in further details with reference to some specific experiments.

Experimental Example 1

Prepared was an experimental sample for the magnetoresistive device having a configuration shown in FIG. 1 and constructed as set out in Table 1 given below.

That is, as shown in Table 1 given below, the magnetoresistive unit 8 having a multilayer arrangement shown in Table 1 was formed on the first shield layer 3 made substantially of NiFe (with a saturation magnetic flux density Bs of 1 T), and the second shield layer 5 made substantially of NiFe (with a saturation magnetic flux density Bs of 1 T) was formed on that magnetoresistive unit 8.

The first 3 and the second shield layer 5 had the same configuration and size.

Referring typically to the second shield layer 5, it was a framework obtained by punching a window of substantially quadrangular shape (15 μm (X-direction)×10 μm (Y-direction)) out of a rectangular sheet at its center which had a thickness (Z-axis direction size) of 2 μm, a width (X-axis direction size) of 27 μm, and a Y-axis direction size or length that was determined as desired depending on the depth length $Y_1$ of the back frame-constituting portion 55.

The depth length $Y_2$ of the front frame-constituting portion 51 for the second shield layer 5 having the magnetoresistive unit 8 formed in proximity to it was 5 μm ($Y_2$=5 μm). Note here that the width $Y_3$ of the side frame-constituting portion 53 was 6.0 μm, and $Y_1$=Yb with Yb set as described below.

As shown in FIGS. 1, 2, 3 and 4, the combination of the nonmagnetic gap layer 155 with the bias magnetic field-applying layer 156 was formed on the site of the back frame-constituting portion 55 for the second shield layer 5.

For the bias magnetic field-applying layer 156, various samples were prepared by repeating the stacking of the multilayer unit once, twice, four times, eight times, sixteen times, and fifty times, which was composed of, in order from the side of the nonmagnetic gap layer 155, the nonmagnetic underlay layer 156a of Cr and the high-coercive material layer 156b of CoPt, as set out in Table 2 given below. In the samples of Table 2 given below, the high-coercive material layer 156b had a total multilayer thickness (total thickness) of 400 nm.

It is noted that the depth length Yb of each of the nonmagnetic gap layer 155 and bias magnetic field-applying layer 156 was the same as the depth length $Y_1$ of the back frame-constituting portion 55; the X-direction width Gp of the nonmagnetic gap layer 155 was 10 μm; and the X-direction width of the bias magnetic field-applying layer 156 was again 10 μm.

The depth length Yb of the nonmagnetic gap layer 155, and bias magnetic field-applying layer 156 was determined in such a way as to turn the shield layers into a single domain with all the samples. That is, the depth length Yb of each sample was determined in such a way as to meet φb/φf(s)=1: φb=φf(s), where φb is the total quantity of the magnetic flux flowing out of the bias magnetic field-applying layer 156, and φf(s) is the saturation quantity of the magnetic flux for saturation of the magnetization of the front frame-constituting portion 51 (see Table 2).

The nonmagnetic gap layer 155 was made of alumina.

TABLE 1

| Multilayer Structure | | | Layer Material | Thickness (nm) |
|---|---|---|---|---|
| | Second Shield Layer (5) | | NiFe | 2000 |
| Magneto-Resistive Unit (8) | Protective Layer (126) | | Ta | 5.0 |
| | | | Ru | 1.0 |
| | Sensor Area | Second Ferromagnetic Layer (150) (Free Layer) | CoFeB | 3.0 |
| | | Nonmagnetic Intermediate Layer (140) | MgO | 1.0 |
| | | Second Ferromagnetic Layer (130) (Fixed Magnetization Layer) — Inner Layer | CoFeB | 3.0 |
| | | Non-magnetic Layer | Ru | 0.8 |
| | | Outer Layer | CoFe | 2.5 |
| | Antiferromagnetic Layer (122) | | IrMn | 6.0 |
| | Underlay Layer (121) | | Ru | 2.0 |
| | | | Ta | 1.0 |
| First Shield Layer (3) | | | NiFe | 2000 |

TABLE 2

Bias Magnetic Field-Applying Layer

| | Number of Stacking | Nonmagnetic Underlay Layer 156a Thickness (nm) | High-Coercive Material Layer 156b Thickness (nm) | High-Coercive Material Layer 156b Total Thickness (nm) | Bias Magnetic Field-Applying Layer 156 Total Thickness (nm) | Yb (nm) |
|---|---|---|---|---|---|---|
| Ex. 1-1 | 2 | 3.5 | 200 | 400 | 407 | 38.7 |
| Ex. 1-2 | 4 | 3.5 | 100 | 400 | 414 | 30.7 |
| Ex. 1-3 | 8 | 3.5 | 50 | 400 | 428 | 25.5 |
| Ex. 1-4 | 16 | 3.5 | 25 | 400 | 456 | 24.9 |
| Ex. 1-5 | 50 | 3.5 | 8 | 400 | 575 | 25.5 |
| Comp. Ex. 1-1 | 1 | 3.5 | 400 | 400 | 403.5 | 54.9 |
| Comp. Ex. 1-2 | 55 | 3.5 | 7.3 | 400 | 592.5 | 64.3 |

Various samples prepared in this way were estimated in terms of magnetic field resistance in the following manner.
(How to Make an Estimation of Magnetic Field Resistance)

Two hundreds (200) devices for the reproducing head were subjected to bar QST (quasi-static-test) at ±500 Oe to investigate outputs $AMP_{before}$.

Then, a stress magnetic field of 500 Oe was applied to 200 devices for the reproducing head in the longitudinal direction.

Thereafter, two hundreds (200) devices for the reproducing head were subjected to bar QST (quasi-static-test) at ±500 Oe to investigate outputs $Amp_{after}$.

Output fluctuations were defined as mentioned below, using the values of $\text{AMP}_{before}$ and $\text{Amp}_{after}$, and devices deviating from the range of ±10% output fluctuations (the range of −10% to +10%) were judged as defectives.

Output Fluctuations=$(\text{Amp}_{after}-\text{Amp}_{before})/\text{Amp}_{before}\times100(\%)$ The incidence of defectives was indicated by percent defective (%).

The results are tabulated in Table 3 together with the residual magnetic flux density Br (G) and coercive force Hc (Oe) of the high-coercive material layer 156b of given thickness in each sample.

TABLE 3

|  | Residual Magnetic Flux Density Br(G) | Coercive Force Hc(Oe) | Percent Defect (%) |
|---|---|---|---|
| Ex. 1-1 | 6459 | 734 | 14.7 |
| Ex. 1-2 | 8145 | 823 | 11.4 |
| Ex. 1-3 | 9798 | 1156 | 5.8 |
| Ex. 1-4 | 10053 | 1345 | 4.9 |
| Ex. 1-5 | 9800 | 1558 | 4.3 |
| Comp. Ex. 1-1 | 4553 | 634 | 26.6 |
| Compo. Ex. 1-2 | 3890 | 558 | 29.7 |

From the results of Table 3, the advantage of the invention would be undisputed.

It is here noted that although the percent defective in Examples 1-1 and 1-2 is not that good, it decreases to half as compared with Comparative Example 1-1 relying on the single layer.

Figure 29:
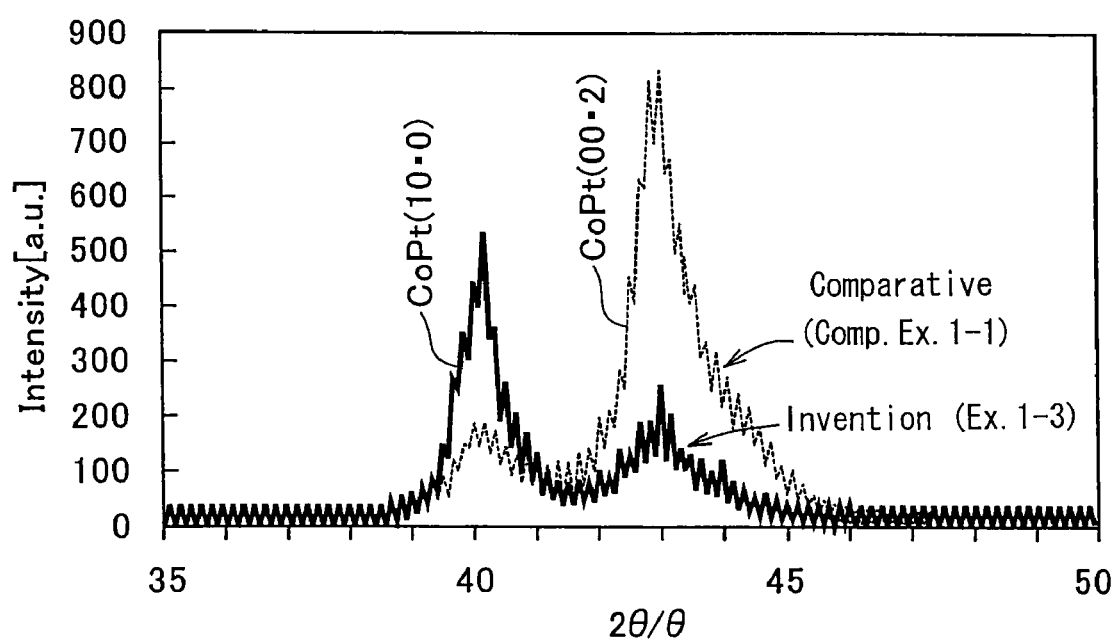
FIG. 29 is a graph for X-ray diffraction intensity.

The high-coercive material layer 156b in Example 1-3, and the high-coercive material layer 156b in Comparative Example 1-1 was measured for X-ray diffraction intensity, with the results shown in FIG. 29.

In the X-ray diffraction intensity graph of FIG. 29, the peak of CoPt (10·0) appearing near θ=40 degrees is indicative of the quantity of the longitudinal component of the easy axis of magnetization while the peak of CoPt (00·2) appearing near θ=43 degrees is indicative of the quantity of the perpendicular component of the easy axis of magnetization. The high-coercive material layer 156b in Example 1-3 is larger than that of Comparative Example 1-1 in terms of the quantity of the longitudinal component of the easy axis of magnetization and smaller than that of Comparative Example 1-1 in terms of the quantity of the perpendicular component of the easy axis of magnetization: it has been found that the sample of Example 1-3 according to the invention is much more improved in terms of longitudinal magnetic bias properties.

Experimental Example 2

Following the preparation of the samples in Experimental Example 1, various samples were prepared while the site corresponding to Table 1 is replaced by such arrangement as set out in Table 4 given below.

In the samples of Table 4, the high-coercive material layer 156b had a total multilayer thickness (total thickness) of 100 nm.

TABLE 4

| | | Bias Magnetic Field-Applying Layer | | | | |
|---|---|---|---|---|---|---|
| | Number of Stacking | Nonmagnetic Underlay Layer 156a Thickness (nm) | High-Coercive Material Layer 156b Thickness (nm) | High-Coercive Material 156b Total Thickness (nm) | Bias Magnetic Field-Applying Layer 156 Total Thickness (nm) | Yb (nm) |
| Ex. 2-1 | 2 | 3.5 | 50 | 100 | 107 | 25.3 |
| Ex. 2-2 | 4 | 3.5 | 25 | 100 | 114 | 24.6 |
| Ex. 2-3 | 12 | 3.5 | 8.3 | 100 | 142 | 24.4 |
| Comp. Ex. 2-1 | 1 | 3.5 | 100 | 100 | 103.5 | 30.4 |
| Comp. Ex. 2-2 | 4 | 3.5 | 7.1 | 100 | 149 | 62.6 |

These samples of Table 4 were estimated in terms of magnetic field resistance in the manner of Example 1. Moreover, the residual magnetic flux density Br (G) and coercive force Hc (Oe) of the high-coercive material layer 156b of given thickness in each sample were measured.

The results are set out in Table 5 given below.

TABLE 5

|  | Residual Magnetic Flux Density Br(G) | Coercive Force Hc(Oe) | Percent Defect (%) |
|---|---|---|---|
| Ex. 2-1 | 9895 | 1208 | 5.4 |
| Ex. 2-2 | 10154 | 1423 | 4.7 |
| Ex. 2-3 | 10243 | 1689 | 4.1 |
| Comp. Ex. 2-1 | 8234 | 912 | 10.9 |
| Comp. Ex. 2-2 | 3995 | 578 | 28.2 |

From the aforesaid results, the advantages of the invention would be undisputed.

That is, the invention provides a magnetoresistive device of the CPP (current perpendicular to plane) structure, comprising a magnetoresistive unit, and a first, substantially soft magnetic shield layer positioned below and a second, substantially soft magnetic shield layer positioned above, which are located and formed such that the magnetoresistive effect is sandwiched between them from above and below, with a sense current applied in the stacking direction, wherein said magnetoresistive unit comprises a nonmagnetic intermediate layer, and a first ferromagnetic layer and a second ferromagnetic layer stacked and formed such that said nonmagnetic intermediate layer is sandwiched between them; at least one of said first shield layer positioned below and said second shield layer positioned above is configured in a framework form having a planar shape (X-Y plane) defined by the width and length directions of the device; said framework has a front frame-constituting portion located on a medium opposite plane side in front and near where the magnetoresistive unit is positioned, and any other frame portion; said any other frame portion partially comprises a combination of a nonmagnetic gap layer with a bias magnetic field-applying layer; said bias magnetic field-applying layer is constructed by repeating the stacking of a multilayer unit at least twice or up to 50 times, wherein said multilayer unit comprises a nonmagnetic underlay layer and a high-coercive material layer; said nonmagnetic gap layer is designed and located such that a magnetic flux given out of said bias magnetic field-applying layer is efficiently sent out to said front frame-constituting portion; and the combination of said nonmagnetic gap layer with said bias magnetic field-applying layer forms a closed magnetic path with a magnetic flux going all the way around said framework, and turns the magnetization of said front frame-constituting portion into a single domain. It is thus possible to make the domain control of the shield layers much more stable, achieve remarkable improvements in resistance to an external magnetic field, and make the operation of the device much more reliable.

INDUSTRIAL APPLICABILITY

The present invention could be applied to the industry of magnetic disk systems comprising a magnetoresistive device operable to read the magnetic field intensity of magnetic recording media or the like as signals.

What we claim is:

1. A magnetoresistive device of a CPP (current perpendicular to plane) structure, comprising a magnetoresistive unit, and a first, substantially soft magnetic shield layer positioned below and a second, substantially soft magnetic shield layer positioned above, which are located and formed such that the magnetoresistive unit is sandwiched between them from above and below, with a sense current applied in a stacking direction, characterized in that:

said magnetoresistive unit comprises a nonmagnetic intermediate layer, and a first ferromagnetic layer and a second ferromagnetic layer stacked and formed such that said nonmagnetic intermediate layer is sandwiched between them, at least one of said first shield layer positioned below and said second shield layer positioned above is configured in a framework form having a planar shape (X-Y plane) defined by the width and length directions of the device, said framework has a front frame-constituting portion located on a medium opposite plane side in front and near where the magnetoresistive unit is positioned, and any other frame portion, said any other frame portion partially comprises a combination of a nonmagnetic gap layer with a bias magnetic field-applying layer, said bias magnetic field-applying layer is constructed by repetitive stacking of a multilayer unit at least twice or up to 50 times, wherein said multilayer unit comprises a nonmagnetic underlay layer and a high-coercive material layer, said nonmagnetic gap layer is designed and located such that a magnetic flux given out of said bias magnetic field-applying layer is efficiently sent out to said front frame-constituting portion, and said combination of the nonmagnetic gap layer with the bias magnetic field-applying layer forms a closed magnetic path with a magnetic flux going all the way around said framework, and turns the magnetization of said front frame-constituting portion into a single domain.

2. The magnetoresistive device according to claim 1, wherein an upper limit to the number of repetitive stacking, N, of the multilayer unit comprising a nonmagnetic underlay layer and a high-coercive material layer and forming a part of said bias magnetic field-applying layer is defined by an integral number part of a value (the disregard of all numbers after the decimal point) obtained by dividing a total thickness in nm of the high-coercive material layers by 8 in nm.

3. The magnetoresistive device according to claim 1, wherein said nonmagnetic underlay layer is composed of at least one selected from the group consisting of Cr, CrTi, CrMo, and TiW, and said high-coercive material layer is composed of at lest one selected from the group consisting of CoPt, CoCrPt, CoCrTa, CoCrPtTa, and CoNiPt.

4. The magnetoresistive device according to claim 1, wherein the nonmagnetic underlay layer and the high-coercive material layer, forming said bias magnetic field-applying layer, have a thickness of 2 to 15 nm and 8 to 50 nm, respectively, with a total thickness of high-coercive material layers being 100 to 400 nm.

5. The magnetoresistive device according to claim 1, wherein said framework comprises a front-frame constituting portion on a medium opposite plane side in front and near where the magnetoresistive unit is positioned, and a back frame-constituting portion located in the rear of said front frame-constituting portion, wherein said back frame-constituting portion is included in said any other frame portion, said back frame-constituting portion has a depth length larger than that of said front frame-constituting portion, and said back frame-constituting portion partially comprises said combination of the nonmagnetic gap layer with the bias magnetic field-applying layer.

6. The magnetoresistive device according to claim 5, wherein:

said second shield layer that is positioned above is configured in a framework having a planar shape (X-Y plane) defined by the width and length directions of the device, said framework comprises a front frame-constituting portion located on a medium opposite plane side in front and near where the magnetoresistive unit is positioned, and a back frame-constituting portion located in the rear of that front frame-constituting portion, the depth length $Y_1$ of said back frame-constituting portion is larger than the depth length $Y_2$ of said front frame-constituting portion ($Y_1 > Y_2$), said back frame-constituting portion partially comprises a combination of a nonmagnetic gap layer with a bias magnetic field-applying layer, said nonmagnetic gap layer is designed and located such that a magnetic flux given out of said bias magnetic field-applying layer is efficiently sent out to said front frame-constituting portion, said combination of the nonmagnetic gap layer with the bias magnetic field-applying layer forms a closed magnetic path with a magnetic flux going all the way around said framework forming said first shield layer, and turns the magnetization of said front frame-constituting portion into a single domain, said first shield layer that is positioned below is configured in a framework having a planar shape (X-Y plane) defined by the width and length directions of the device, said framework comprises a front frame-constituting portion located on a medium opposite plane side in front and near where the magnetoresistive unit is positioned, and a back frame-constituting portion located in the rear of that front frame-constituting portion, the depth length $Y_{11}$ of said back frame-constituting portion is larger than the depth length $Y_{22}$ of said front frame-constituting portion ($Y_{11} > Y_{22}$), said back frame-constituting portion partially comprises a combination of a nonmagnetic gap layer with a bias magnetic field-applying layer,
said nonmagnetic gap layer is designed and located such that a magnetic flux given out of said bias magnetic field-applying layer is efficiently sent out to said front frame-constituting portion,
said combination of the nonmagnetic gap layer with the bias magnetic field-applying layer forms a closed magnetic path with a magnetic flux going all the way around said framework forming said first shield layer, and turns the magnetization of said front frame-constituting portion into a single domain.

7. The magnetoresistive device according to claim 6, wherein each of said first and second shield layers has a thickness of 0.5 to 2.0 μm.

8. The magnetoresistive device according to claim 5, wherein both ends of said magnetoresistive unit in the width direction (X-direction) are provided with a device bias-applying layer for applying a bias magnetic field to the first or second ferromagnetic layer functioning as a free layer.

9. The magnetoresistive device according to claim 8, wherein said bias magnetic field-applying layers and device bias-applying layer are magnetized integrally and simultaneously in the width direction (X-direction).

10. The magnetoresistive device according to claim 1, wherein $\phi b/\phi f(s)$ is set within the range of 0.3 to 2.0 where $\phi b$ is the total quantity of a magnetic flux flowing out of said bias magnetic field-applying layer and $\phi f(s)$ is the saturation quantity of a magnetic flux for saturation of magnetization of the front frame-constituting portion where said magnetoresistive unit is positioned.

11. The magnetoresistive device according to claim 1, wherein each of the first ferromagnetic layer and second ferromagnetic layer forming a part of said magnetoresistive unit receives action such that, under influences of magnetic action of the front frame-constituting portions for said first and second shield layers, there is an antiparallel magnetization state created, in which mutual magnetizations are in opposite directions.

12. The magnetoresistive device according to claim 11, wherein each of the frameworks for said first and second shield layers comprise a front frame-constituting portion located on the medium opposite plane side in front and near where the magnetoresistive unit is positioned and a side frame-constituting portion located at a side position extending from the end of said front frame-constituting portion in a rear direction,
said side-frame constituting portion is included in said any other frame portion,
the width $Y_1$ of the side frame-constituting portion for said first shield layer is larger than the depth length $Y_2$ of the front frame-constituting portion for said first shield layer ($Y_1 > Y_2$),
the width $Y_3$ of the side frame-constituting portion for said second shield layer is larger than the depth length $Y_4$ of the front frame-constituting portion for said second shield layer ($Y_3 > Y_4$),
the side frame-constituting portion for said first shield layer partially comprises a combination of a first nonmagnetic gap layer with a first bias magnetic field-applying layer wherein said first nonmagnetic gap layer is designed and located in such a way as to efficiently send a magnetic flux given out of said first bias magnetic field-applying layer out to the front frame-constituting portion for said first shield layer, and said combination of the first nonmagnetic gap layer with the first bias magnetic field-applying layer forms a closed magnetic path with a magnetic flux going all the way around the framework forming said first shield layer and turns into a single domain the magnetization of the front frame-constituting portion for said first shield layer and control the direction of that magnetization, and
the side frame-constituting portion for said second shield layer partially comprises a combination of a second nonmagnetic gap layer with a second bias magnetic field-applying layer wherein said second nonmagnetic gap layer is designed and located in such a way as to efficiently send a magnetic flux given out of said second bias magnetic field-applying layer out to the front frame-constituting portion for said second shield layer, and said combination of the second nonmagnetic gap layer with the second bias magnetic field-applying layer forms a closed magnetic path with a magnetic flux going all the way around the framework forming said second shield layer and turns into a single domain the magnetization of the front frame-constituting portion for said second shield layer and controls the direction of that magnetization.

13. The magnetoresistive device according to claim 12, wherein said first ferromagnetic layer forming a part of said magnetoresistive unit is indirectly magnetically coupled to the front frame-constituting portion for said first shield layer having a controlled direction of magnetization by way of a first exchange coupling function gap layer, and
said second ferromagnetic layer forming a part of said magnetoresistive unit is indirectly magnetically coupled to the front frame-constituting portion for said second shield layer having a controlled direction of magnetization by way of a second exchange coupling function gap layer.

14. The magnetoresistive device according to claim 13, wherein said first exchange coupling function gap layer comprises, in order from said first shield layer side, an exchange coupling transfer layer, a gap adjustment layer and an exchange coupling adjustment layer, and
said second exchange coupling function gap layer comprises, in order from said second shield layer side, an exchange coupling transfer layer, a gap adjustment layer and an exchange coupling adjustment layer.

15. The magnetoresistive device according to claim 14, wherein said exchange coupling transfer layer is made up of at least one material selected from the group consisting of Ru, Rh, Ir, Cr, Cu, Ag, Au, Pt, and Pd,
said gap adjustment layer is made up of a ferro-magnetic material, and
said exchange coupling adjustment layer is made up of at least one material selected from the group consisting of Ru, Rh, Ir, Cr, Cu, Ag, Au, Pt, and Pd.

16. The magnetoresistive device according to claim 13, wherein said first exchange coupling function gap layer comprises, in order from said first shield layer side, an exchange coupling transfer layer, a gap adjustment layer, an exchange coupling transfer layer, a gap adjustment layer, and an exchange coupling adjustment layer, and
said second exchange coupling function gap layer comprises, in order from said second shield layer side, an exchange coupling transfer layer, a gap adjustment layer, an exchange coupling transfer layer, a gap adjustment layer, and an exchange coupling adjustment layer.

17. The magnetoresistive device according to claim 12, wherein said nonmagnetic intermediate layer is made up of a triple-layer structure with ZnO located at the center thereof.

18. The magnetoresistive device according to claim 12, wherein in said first shield layer, $\phi'b/\phi'f(s)=0.3$ to 2.0 where $\phi'b$ is the total quantity of a magnetic flux flowing out of the first bias magnetic field-applying layer and $\phi'f(s)$ is the saturation quantity of a magnetic flux for saturation of magnetization of the front frame-constituting portion, and in said second shield layer, $\phi b/\phi f(s)=0.3$ to 2.0 where $\phi b$ is the total quantity of a magnetic flux flowing out of the second bias magnetic field-applying layer and $\phi f(s)$ is the saturation quantity of a magnetic flux for saturation of magnetization of the front frame-constituting portion.

19. The magnetoresistive device according to claim 12, wherein said first and second shield layers each have a thickness of 0.5 to 2.0 μm, and said first and second bias magnetic field-applying layers each have a thickness of 0.1 to 0.3 μm.

20. The magnetoresistive device according to claim 11, wherein in the length direction (Y-direction) of the depth side of said magnetoresistive unit, there is a device bias-applying layer located to define a magnetization direction angle as an initial state with the first and second ferromagnetic layers functioning as free layers.

21. The magnetoresistive device according to claim 20, wherein said bias magnetic field-applying layers and device bias-applying layer are magnetized integrally and simultaneously in the length direction (Y-direction).

22. The magnetoresistive device according to claim 11, wherein each of the frameworks for said first and second shield layers comprises a front frame-constituting portion located on the medium opposite plane side and near where the magnetoresistive unit is positioned, and a coil is wound around a part of each of the frameworks for said first and second shield layers, so that by a magnetic flux generated by passing a current through said coil, the magnetization of the front frame-constituting portion for each of said first and second shield layers is turned into a single domain and the direction of magnetization is controlled.

23. A thin-film magnetic head, characterized by comprising:
a plane in opposition to a recording medium, and
a magnetoresistive device as recited in claim 1, which is located near said medium opposite plane to detect a signal magnetic field from said recording medium.

24. A head gimbal assembly, characterized by comprising:
a slider including a thin-film magnetic head as recited in claim 23 and located in such a way as to oppose to a recording medium, and
a suspension adapted to resiliently support said slider.

25. A magnetic disk system, characterized by comprising:
a slider including a thin-film magnetic head as recited in claim 23 and located in such a way as to oppose to a recording medium, and
a positioning device adapted to support and position said slider with respect to said recording medium.

* * * * *